US009597869B2

(12) United States Patent
Matsumoto

(10) Patent No.: US 9,597,869 B2
(45) Date of Patent: Mar. 21, 2017

(54) LIQUID DISCHARGE APPARATUS

(71) Applicant: Seiko Epson Corporation, Tokyo (JP)

(72) Inventor: Yusuke Matsumoto, Shiojiri (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 15/142,339

(22) Filed: Apr. 29, 2016

(65) Prior Publication Data

US 2016/0339690 A1 Nov. 24, 2016

(30) Foreign Application Priority Data

May 22, 2015 (JP) ................................ 2015-104276

(51) Int. Cl.
*B41J 2/045* (2006.01)
*H01L 27/088* (2006.01)

(52) U.S. Cl.
CPC ....... *B41J 2/04541* (2013.01); *B41J 2/04586* (2013.01); *H01L 27/088* (2013.01)

(58) Field of Classification Search
CPC B41J 2/04541; B41J 2/04581; B41J 2/04585; B41J 2/04586; B41J 2/04588; H01L 27/088
See application file for complete search history.

(56) References Cited

U.S. PATENT DOCUMENTS

| | | | | |
|---|---|---|---|---|
| 5,477,245 A * | 12/1995 | Fuse | B41J 2/04541 347/10 |
| 6,382,755 B1 * | 5/2002 | Imanaka | B41J 2/04541 347/10 |
| 7,036,899 B2 * | 5/2006 | Sato | B41J 2/04541 347/10 |
| 7,077,502 B2 * | 7/2006 | Mitsuzawa | B41J 2/04563 347/17 |
| 7,518,969 B2 * | 4/2009 | Masui | G11B 7/0062 369/47.19 |
| 2009/0027437 A1 | 1/2009 | Azami et al. | |

FOREIGN PATENT DOCUMENTS

| | | |
|---|---|---|
| JP | 2009-028913 A | 2/2009 |
| JP | 2010-221500 A | 10/2010 |

* cited by examiner

*Primary Examiner* — Anh T. N. Vo
(74) *Attorney, Agent, or Firm* — Harness, Dickey & Pierce, P.L.C.

(57) ABSTRACT

A liquid discharge apparatus includes a head that is driven by drive signals and that is capable of discharging a liquid, a circuit substrate, and generators that are provided on the circuit substrate and that generate the drive signals. The generators include a first transistor, a second transistor, a third transistor, and a fourth transistor. Distance between the first transistor and the third transistor is longer than at least one of distance between the first transistor and the second transistor and distance between the first transistor and the fourth transistor.

6 Claims, 14 Drawing Sheets

| | SI[q][m] (b1, b2) | Ts1 | | Ts2 | |
|---|---|---|---|---|---|
| | | SLa[q][m] | SLb[q][m] | SLa[q][m] | SLb[q][m] |
| LARGE DOT | (1, 1) | H | L | H | L |
| MEDIUM-SIZED DOT | (1, 0) | H | L | L | H |
| SMALL DOT | (0, 1) | L | H | H | L |
| NON-RECORDING | (0, 0) | L | H | L | H |

LIQUID DISCHARGE APPARATUS

The entire disclosure of Japanese Patent Application No. 2015-104276, filed May 22, 2015 is expressly incorporated by reference herein.

BACKGROUND

1. Technical Field

The present invention relates to a liquid discharge apparatus.

2. Related Art

A liquid discharge apparatus, such as an ink jet printer, forms an image on a recording medium by driving a discharge portion provided in a head unit through the use of a drive signal and discharging from a nozzle of the discharge portion a liquid, such as ink, charged in a cavity (pressure chamber) of the discharge portion. Some such liquid discharge apparatuses are provided with a plurality of head units in order to meet the need for increased printing speed or increased resolution and size of images to be formed, and the like. Usually, in a liquid discharge apparatus equipped with a plurality of head units, a plurality of drive signal generation circuits that generate drive signals are provided in order to supply drive signals to each of the head units (see, e.g., JP-A-2009-028913 or JP-A-2010-221500).

The drive signal for driving the discharge portion is a large-amplitude signal and the drive signal generation circuit produces heat when generating the drive signal. Therefore, when the plurality of drive signal generation circuits simultaneously generate drive signals, a circuit substrate where the drive signal generation circuits are provided becomes hot. In that case, the operation of the drive signal generation circuits becomes inaccurate so that there may sometimes occur a defective condition such as low quality of the image that the liquid discharge apparatus forms, failure of one or more of the drive signal generation circuits, etc.

SUMMARY

An advantage of some aspects of the invention is that in a liquid discharge apparatus having a plurality of drive signal generation circuits, the possibility of occurrence of a defective condition caused by heat produced by the drive signal generation circuits, such as low image quality, failure of one or more of the drive signal generation circuits, etc. is reduced.

One aspect of the invention provides a liquid discharge apparatus that includes a first head unit that is driven by a first drive signal and a second drive signal and that is capable of discharging a liquid, a second head unit that is driven by a third drive signal and a fourth drive signal and that is capable of discharging a liquid, a circuit substrate, a first generator that is provided on the circuit substrate and that generates the first drive signal, a second generator that is provided on the circuit substrate and that generates the second drive signal, a third generator that is provided on the circuit substrate and that generates the third drive signal, and a fourth generator that is provided on the circuit substrate and that generates the fourth drive signal. The first generator includes a first modulator that generates a first modulated signal by pulse-modulating a first definition signal that defines a waveform of the first drive signal, a first amplifier that includes a first transistor and that generates a first amplified signal by amplifying the first modulated signal by using the first transistor, and a first smoother that generates the first drive signal by smoothing the first amplified signal. The second generator includes a second modulator that generates a second modulated signal by pulse-modulating a second definition signal that defines a waveform of the second drive signal, a second amplifier that includes a second transistor and that generates a second amplified signal by amplifying the second modulated signal by using the second transistor, and a second smoother that generates the second drive signal by smoothing the second amplified signal. The third generator includes a third modulator that generates a third modulated signal by pulse-modulating a third definition signal that defines a waveform of the third drive signal, a third amplifier that includes a third transistor and that generates a third amplified signal by amplifying the third modulated signal by using the third transistor, and a third smoother that generates the third drive signal by smoothing the third amplified signal. The fourth generator includes a fourth modulator that generates a fourth modulated signal by pulse-modulating a fourth definition signal that defines a waveform of the fourth drive signal, a fourth amplifier that includes a fourth transistor and that generates a fourth amplified signal by amplifying the fourth modulated signal by using the fourth transistor, and a fourth smoother that generates the fourth drive signal by smoothing the fourth amplified signal. Amount of heat that the first transistor produces when generating the first amplified signal is larger than amount of heat that the second transistor produces when generating the second amplified signal. Amount of heat that the third transistor produces when generating the third amplified signal is larger than amount of heat that the fourth transistor produces when generating the fourth amplified signal. Distance between the first transistor and the third transistor is longer than at least one of distance between the first transistor and the second transistor and distance between the first transistor and the fourth transistor.

In this liquid discharge apparatus, the distance between the first transistor and the third transistor is longer than the distance between the first transistor and the second transistor or the distance between the first transistor and the fourth transistor. Therefore, the liquid discharge apparatus can prevent an incident in which heat produced by the first transistor, which produces relatively large amount of heat, and heat produced by the third transistor, which also produces relatively large amount of heat, concentrate into a fractional region in the circuit substrate so that the circuit substrate becomes hot. Hence, the rise in temperature of the circuit substrate when the first to fourth drive signals are generated can be made small in comparison with an arrangement in which the distance between the first transistor and the third transistor is relatively short. That is, this aspect of the invention makes it possible to prevent or restrain a defective condition from being caused by heat produced when the first to fourth drive signals are generated.

In the foregoing liquid discharge apparatus, the first smoother may include a first inductor and a first capacitor for smoothing the first amplified signal, the second smoother may include a second inductor and a second capacitor for smoothing the second amplified signal, the third smoother may include a third inductor and a third capacitor for smoothing the third amplified signal, the fourth smoother may include a fourth inductor and a fourth capacitor for smoothing the fourth amplified signal, and distance between the first inductor and the third inductor may be longer than at least one of distance between the first inductor and the second inductor and distance between the first inductor and the fourth inductor.

According to this embodiment, it is possible to prevent an incident in which heat produced by the first inductor, which produces large amount of heat when smoothing the signal, and heat produced by the third inductor, which also produces large amount of heat when smoothing the signal, concentrate into a fractional region in the circuit substrate so that the circuit substrate becomes hot. Therefore, the rise in temperature of the circuit substrate when the first to fourth drive signals are generated can be made small in comparison with an arrangement in which the distance between the first inductor and the third inductor is relatively short. That is, this embodiment of the invention makes it possible to prevent or restrain a defective condition from being caused by heat produced when the first to fourth drive signals are generated.

furthermore, in the foregoing liquid discharge apparatus, the distance between the first transistor and the third transistor may be longer than the distance between the first transistor and the second transistor and longer than the distance between the first transistor and the fourth transistor.

According to this embodiment, since the distance between the first transistor and the third transistor is longer than the distance between the first transistor and the second transistor and longer than the distance between the first transistor and the fourth transistor, it is possible to prevent an incident in which heat produced by the first transistor, which produces large amount of heat, and heat produced by the third transistor, which produces large amount of heat, concentrate into a fractional region in the circuit substrate so that the circuit substrate becomes hot. Thus, it becomes possible to prevent or restrain a defective condition from being caused by heat produced when the first to fourth drive signals are generated.

Furthermore, in the foregoing liquid discharge apparatus, the first modulated signal, the second modulated signal, the third modulated signal, and the fourth modulated signal may have a frequency greater than or equal to 1 MHz and less than or equal to 8 MHz.

With regard to liquid discharge apparatuses, it has been known that frequency spectrum analysis of the waveform of a drive signal supplied to discharged liquid reveals that the signal contains a frequency component that is higher than or equal to 50 kHz. In order to generate the first to fourth drive signals that contain a frequency component higher than or equal to 50 kHz, it is preferable that the frequency of the first to fourth modulated signals and the frequency of the first to fourth amplified signals be greater than or equal to 1 MHz. On the other hand, if the frequency of the first to fourth modulated signals is made higher than 8 MHz, the switching loss in the first to fourth transistors will become large.

According to this embodiment, since the frequency of the first to fourth modulated signals is greater than or equal to 1 MHz and less than or equal to 8 MHz, the reproducibility of the waveforms of the first to fourth drive signals which are defined by the first to fourth definition signals can be increased and the electric power consumed to generate the first to fourth drive signals can be reduced.

Furthermore, in this embodiment, the first to fourth modulated signals have a high frequency that is greater than or equal to 1 MHz and the amount of heat produced by the first to fourth transistors is large. However, since heat from the first to fourth transistors is prevented from concentrating into a fractional region in the circuit substrate, the rise in temperature of the circuit substrate can be made small.

In the foregoing liquid discharge apparatus, volume of the liquid that the first head unit is capable of discharging when driven by the first drive signal may be larger than volume of the liquid that the first head unit is capable of discharging when driven by the second drive signal, and volume of the liquid that the second head unit is capable of discharging when driven by the third drive signal may be larger than volume of the liquid that the second head unit is capable of discharging when driven by the fourth drive signal.

In this embodiment, the amount of heat that the first transistor produces when working to generate the first drive signal is larger than the amount of heat that the second transistor produces when working to generate the second drive signal, and the amount of heat that the third transistor produces when working to generate the third drive signal is larger than the amount of heat that the fourth transistor produces when working to generate the fourth drive signal. However, since the distance between the first transistor and the third transistor is relatively long, heat produced by the first transistor and heat produced by the third transistor can be prevented from concentrating into a fractional region in the circuit substrate. Therefore, it becomes possible to prevent or restrain a defective condition from being caused by heat produced when the first to fourth drive signals are generated.

Note that, in this embodiment, the volume of the liquid that the first and second head units are capable of discharging is assumed to include the volume of the liquid at the time of non-discharge of the liquid, that is, a volume of 0.

Another aspect of the invention provides a liquid discharge apparatus that includes a first head unit that is driven by a first drive signal and a second drive signal and that is capable of discharging a liquid, a second head unit that is driven by a third drive signal and a fourth drive signal and that is capable of discharging a liquid, a circuit substrate, a first generator that is provided on the circuit substrate and that generates the first drive signal, a second generator that is provided on the circuit substrate and that generates the second drive signal, a third generator that is provided on the circuit substrate and that generates the third drive signal, and a fourth generator that is provided on the circuit substrate and that generates the fourth drive signal. The first generator includes a first transistor for amplifying a first definition signal that defines a waveform of the first drive signal, and generates the first drive signal according to a signal having been amplified by the first transistor. The second generator includes a second transistor for amplifying a second definition signal that defines a waveform of the second drive signal, and generates the second drive signal according to a signal having been amplified by the second transistor, The third generator includes a third transistor for amplifying a third definition signal that defines a waveform of the third drive signal, and generates the third drive signal according to a signal having been amplified by the third transistor. The fourth generator includes a fourth transistor for amplifying a fourth definition signal that defines a waveform of the fourth drive signal, and generates the fourth drive signal according to a signal having been amplified by the fourth transistor. Amplitude of the first drive signal is larger than amplitude of the second drive signal. Amplitude of the third drive signal is larger than amplitude of the fourth drive signal. Distance between the first transistor and the third transistor is longer than at least one of distance between the first transistor and the second transistor and distance between the first transistor and the fourth transistor.

According to this aspect of the invention, it is possible to prevent an incident in which heat produced by the first transistor, which produces large amount of heat, and heat produced by the third transistor, which also produces large amount of heat, concentrate into a fractional region in the circuit substrate so that the circuit substrate becomes hot. Therefore, the rise in temperature of the circuit substrate when the first to fourth drive signals are generated can be made small, and therefore a defective condition can be prevented or restrained from being caused by heat produced when the first to fourth drive signals are generated.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
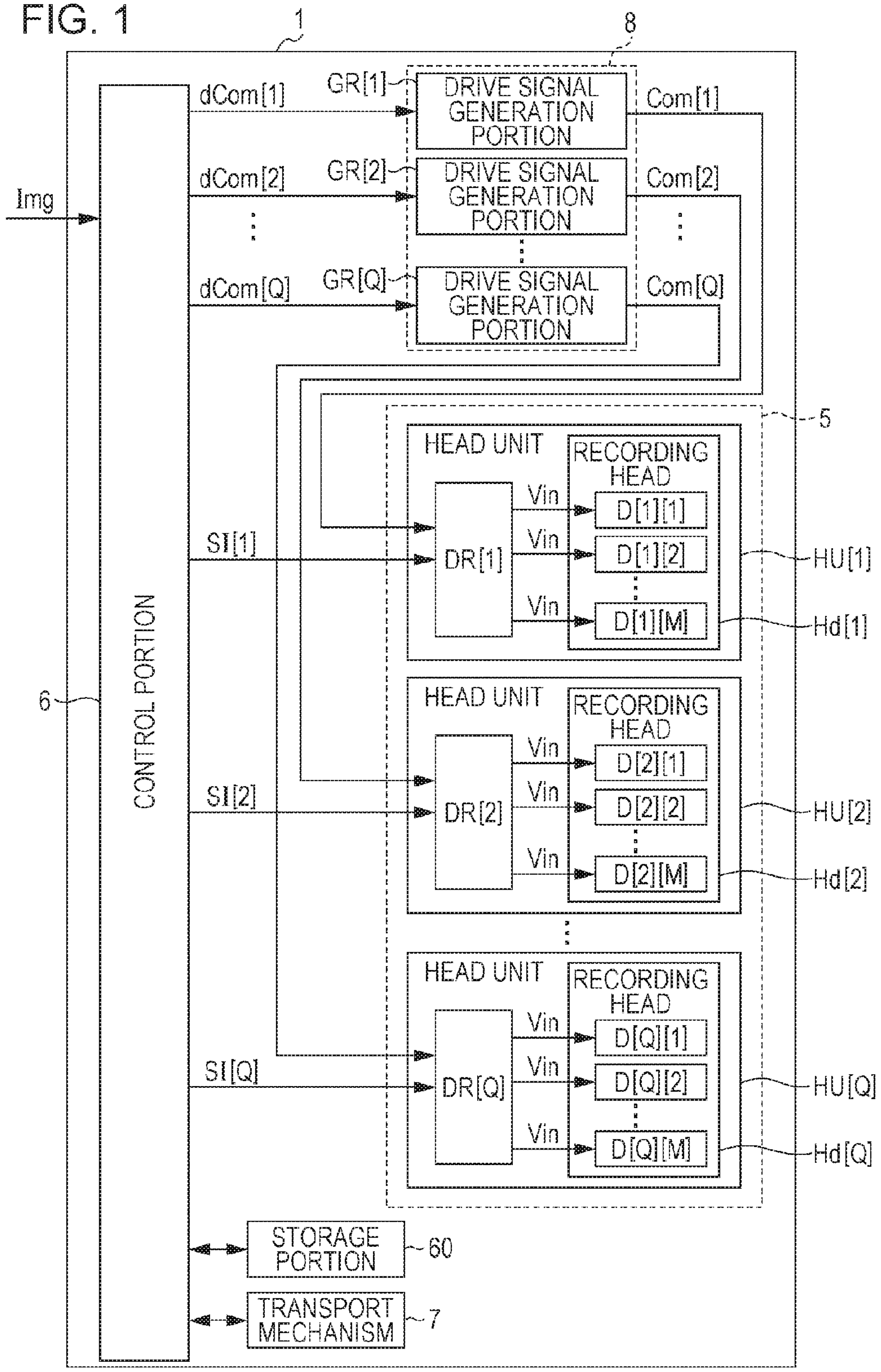
FIG. 1 is a block diagram showing a configuration of an ink jet printer according to an exemplary embodiment of the invention.

Exemplary embodiments of the invention will be described hereinafter with reference to the drawings. Note that in the drawings, dimensions and scales of various portions are different from the actual ones. Furthermore, the following exemplary embodiments are preferred concrete examples of the invention and therefore provided with technologically preferred various limitations. However, such limitations do not restrict the scope of the invention unless it is specifically mentioned below that a particular limitation restricts the invention.

A. Exemplary Embodiment

In conjunction with this exemplary embodiment, an ink jet printer that forms an image on a recording sheet P (an example of a "medium" in the invention) by discharging an ink (an example of a "liquid" in the invention) will be described as an example of a liquid discharge apparatus.

1. General Description of Ink Jet Printer

Figure 2:
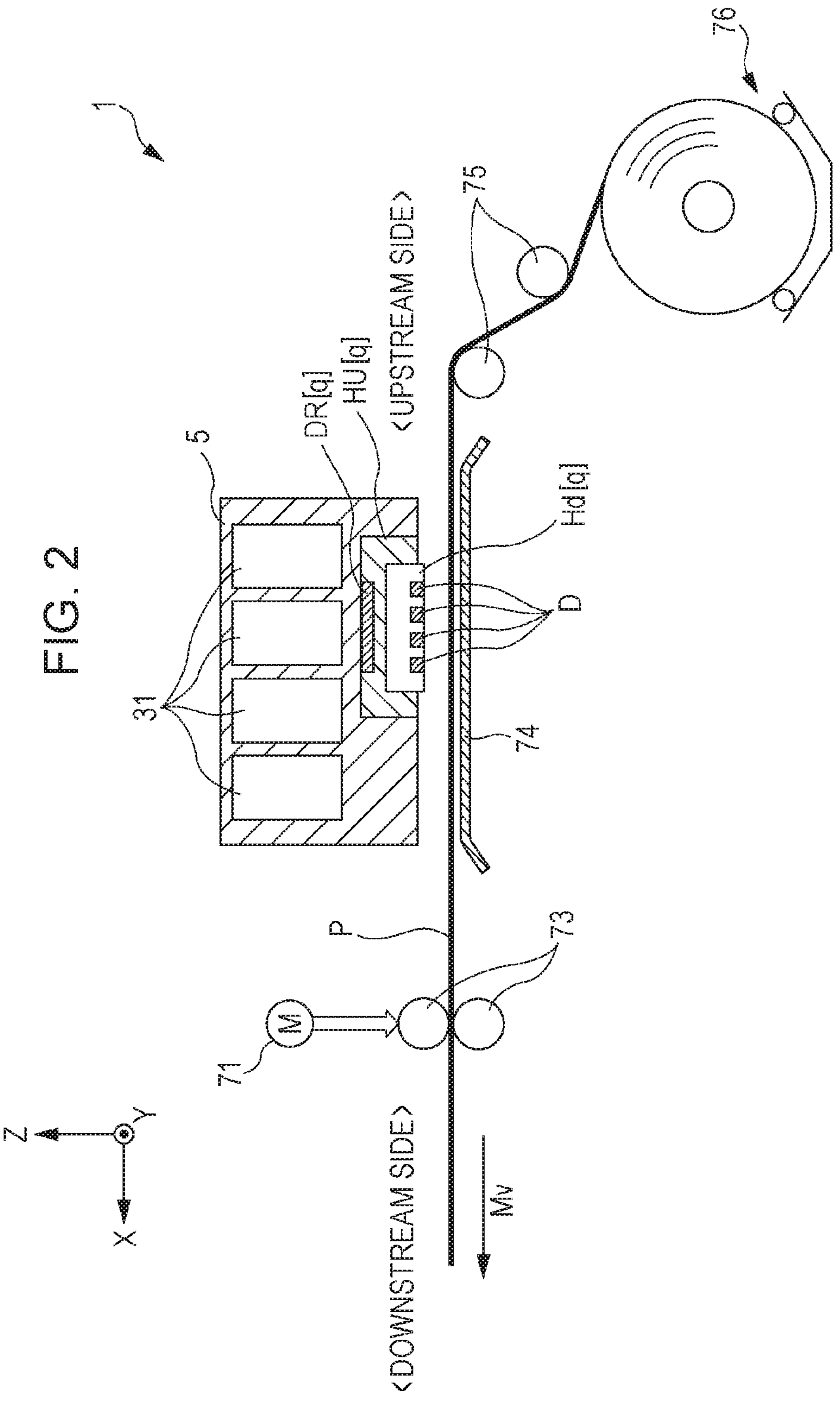
FIG. 2 is a schematic partial sectional view of the ink jet printer.

With reference to FIGS. 1 and 2, a configuration of an ink jet printer 1 according to this exemplary embodiment will be described.

FIG. 1 is a function block diagram showing a configuration of the ink jet printer 1. When the ink jet printer 1 is supplied with print data Img that represent an image to be formed by the ink jet printer 1 from a host computer (not shown in the drawings), such as a personal computer or a digital camera, the ink jet printer 1 executes a print process of forming the image that the print data Img represent on the recording sheet P. In the following description of this exemplary embodiment, the ink jet printer 1 is assumed to be a line printer as an example.

As shown in FIG. 1, the ink jet printer 1 includes a head module 5 that includes head units HU each provided with discharge portions D that discharge ink and a drive module 8 that includes drive signal generation portions GR that each generate a drive signal Com for driving a corresponding one of the head units HU. The ink jet printer 1 further includes a transport mechanism 7 for changing the position of the recording sheet P relative to the head module 5, a control portion 6 that controls operations of various portions of the ink jet printer 1, and a storage portion 60 that stores control programs of the ink jet printer 1 and other information.

The storage portion 60 includes an EEPROM (electrically erasable programmable read-only memory) that is a kind of non-volatile semiconductor memory that stores the print data Img supplied from the host computer, a RAM (random access memory) that temporarily stores data necessary to execute various processes such as the print process and also temporarily stores control programs for controlling various portions of the ink jet printer 1, and a PROM (programmable read-only memory) that is a kind of non-volatile semiconductor memory that stores the control programs.

The control portion 6 further includes a CPU (central processing unit), an FPGA (field-programmable gate array), etc., and controls the operations of the various portions of the ink jet printer 1 as the CPU and the like operate according to the control programs stored in the storage portion 60.

Then, on the basis of the print data Img and the like supplied from the host computer, the control portion 6 controls the head module 5, the transport mechanism 7, and the drive module 8 to control the execution of the print process of forming the image according to the print data Img on the recording sheet P.

Concretely, the control portion 6 first stores into the storage portion 60 the print data Img supplied from the host computer. Next, on the basis of various data stored in the storage portion 60, such as the print data Img, the control portion 6 generates definition signals dCom that define the waveforms of the drive signals Com that the drive module 8 generates and print signals SI that determine, regarding each of the discharge portions D provided in the head module 5, whether or not there is discharge of ink to be performed, the amount of ink to be discharged, etc. Furthermore, on the basis of the various data stored in the storage portion 60, such as the print data Img, the control portion 6 generates a signal for controlling the operation of the transport mechanism 7.

Therefore, the control portion 6 controls the operation of the head module 5 so that the plurality of discharge portions D discharge amounts of ink commensurate with the print data Img while controlling the operation of the transport mechanism 7 so that the recording sheet P is transported in a predetermined direction. Thus, the control portion 6 regulates the sizes and arrangements of dots formed by the ink discharged onto the recording sheet P and therefore controls the execution of the print process of forming an image that corresponds to the print data Img.

As shown in FIG. 1, the head module 5 includes Q number of head units HU (HU[1] to HU[Q]) (Q is a natural number greater than or equal to 2). The qth head unit HU[q] includes a head driver DR[q] and a recording head Hd[q] (q is a natural number that satisfies 1≤q≤Q). The recording head Hd[q] includes M number of discharge portions D (in this exemplary embodiment, M is a natural number greater than or equal to 4).

In the following description, each of the M number of discharge portions D provided in the recording head Hd[q] will be sometimes termed the discharge portion of the first, second, . . . , or Mth stage in order to discriminate each one of the discharge portions D. Furthermore, in the following description, of the discharge portions D provided in the recording head Hd[q], the discharge portion D of the mth stage will be sometimes presented as the discharge portion D[q][m] (variable m is a natural number that satisfies 1≤m≤M).

Furthermore, in the following description, of the print signals SI generated by the control portion 6, the print signal SI supplied to the recording head Hd[q] will be referred to as print signal SI[q]. The print signal SI[q] is a digital signal and includes M number of print signals SI[q][1] to SI[q][M] that correspond one-to-one to the M number of discharge portions D[q][1] to D[q][M]. That is, the print signal SI[q][m] determines whether or not to discharge ink from the discharge portion D[q][m] and the amount of ink to be discharged therefrom.

In the following description, of the drive signals Com that the drive module 8 generates, the drive signal Com supplied to the recording head Hd[q] will be referred to as drive signal Com[q]. The drive signals Com are analog signals having a waveform for driving the corresponding discharge portions D. The drive signal Com[q], although detailed later, contains a drive signal Com-A[q] and a drive signal Com-B[q] (see FIG. 8). In the following description, the drive signals Com-A[q] and Com-B[q] will sometimes be collectively referred to as drive signals Com-P[q]. That is, the drive signal Com[q] contains two drive signals Com-P[q].

Furthermore, in the following description, of the definition signals dCom that the control portion 6 generates, the definition signal dCom that defines the waveform of the drive signal Com[q] will be referred to as definition signal dCom[q]. The definition signal dCom[q], although detailed later, contains a definition signal dCom-A[q] that defines the waveform of the drive signal Com-A[q] and a definition signal dCom-B[q] that defines the waveform of the drive signal Com-B[q]. In the following description, the definition signals dCom-A[q] and dCom-B[q] will sometimes be collectively referred to as definition signals dCom-P[q]. That is, the definition signal dCom[q] contains two definition signals dCom-P[q]. In this exemplary embodiment, the definition signal dCom[q] is a digital signal.

As shown in FIG. 1, the drive module 8 includes Q number of drive signal generation portions GR[1] to GR[Q] that correspond one-to-one to the Q number of head units HU[1] to HU[Q]. Of these drive signal generation portions, the drive signal generation portion GR[q] converts the definition signal dCom[q] supplied from the control portion 6 into an analog signal and amplifies the analog signal to generate the drive signal Com[q]. Although detailed later, the drive signal generation portion GR[q] includes a drive signal generation circuit GR-A[q] that generates a drive signal Com-A[q] on the basis of the definition signal dCom-A[q] and a drive signal generation circuit GR-B[q] that generates a drive signal Com-B[q] on the basis of the definition signal dCom-B[q] (see FIG. 10). In the following description, the drive signal generation circuits GR-A[q] and GR-B[q] will sometimes be collectively referred to as drive signal generation circuits GR-P[q]. That is, the drive signal generation portion GR[q] includes two drive signal generation circuits GR-P[q].

As described above, the head unit HU[q] includes the head driver DR[q] and the recording head Hd[q]. The head driver DR[q] generates individual drive signals Vin for driving the individual discharge portions D[q][1] to D[q][M] provided in the recording head Hd[q], on the basis of various signals, such as the drive signal Com[q] (drive signals Com-A[q] and Com-B[q]) supplied from the drive signal generation portion GR[q] of the drive module 8 and the print signal SI[q] supplied from the control portion 6. In the following description, of the individual drive signals Vin that the head driver DR[q] generates, the individual drive signal Vin for driving the discharge portion D[q][m] will be referred to as individual drive signal Vin[q][m].

FIG. 2 is a partial sectional view of the ink jet printer 1, schematically showing an internal configuration thereof.

As shown in this drawing, the ink jet printer 1 is equipped with four ink cartridges 31. Although in this drawing, the ink cartridges 31 are provided in the head module 5, this configuration is a mere example and the ink cartridges 31 may be provided at other locations in the ink jet printer 1. The four ink cartridges 31 are provided corresponding one-to-one to four colors (CMYK), that is, black, cyan, magenta, and yellow, and each ink cartridge 31 is filled with a corresponding one of the color inks.

As shown in FIG. 2, the transport mechanism 7 includes a transport motor 71 that serves as a drive power source for transporting the recording sheet P, a motor driver (not shown) for driving the transport motor 71, a platen 74 provided below the head module 5 (in a −Z direction from the head module 5 in FIG. 2), transport rollers 73 that are rotated by operating the transport motor 71, guide rollers 75 that are each provided freely rotatably about a Y axis in FIG. 2, and a housing portion 76 that houses the recording sheet P in a rolled-up state. When the ink jet printer 1 executes the print process, the transport mechanism 7 feeds out the recording sheet P from the housing portion 76 and transports the recording sheet P along a transport path defined by the guide rollers 75, the platen 74, and the transport rollers 73 at, for example, a transport speed My in a +X direction (direction from an upstream side to a downstream side) in the drawing.

Each of the discharge portions D provided in the head module 5 is supplied with the ink from one of the four ink cartridges 31. Each discharge portion D is capable of holding the ink from the ink cartridge 31 therein and discharging the ink held therein from a nozzle N provided in the discharge portion D. Concretely, each discharge portion D forms on the recording sheet P dots that constitute an image by discharging the ink onto the recording sheet P at a timing at which the transport mechanism 7 transports the recording sheet P over the platen 74. Then, (Q×M) number of discharge portions D in total provided in the head units HU[1] to HU[Q] discharge the four color inks (CMYK) as a whole to realize full color printing.

2. Configuration of Recording Head

Figure 3:
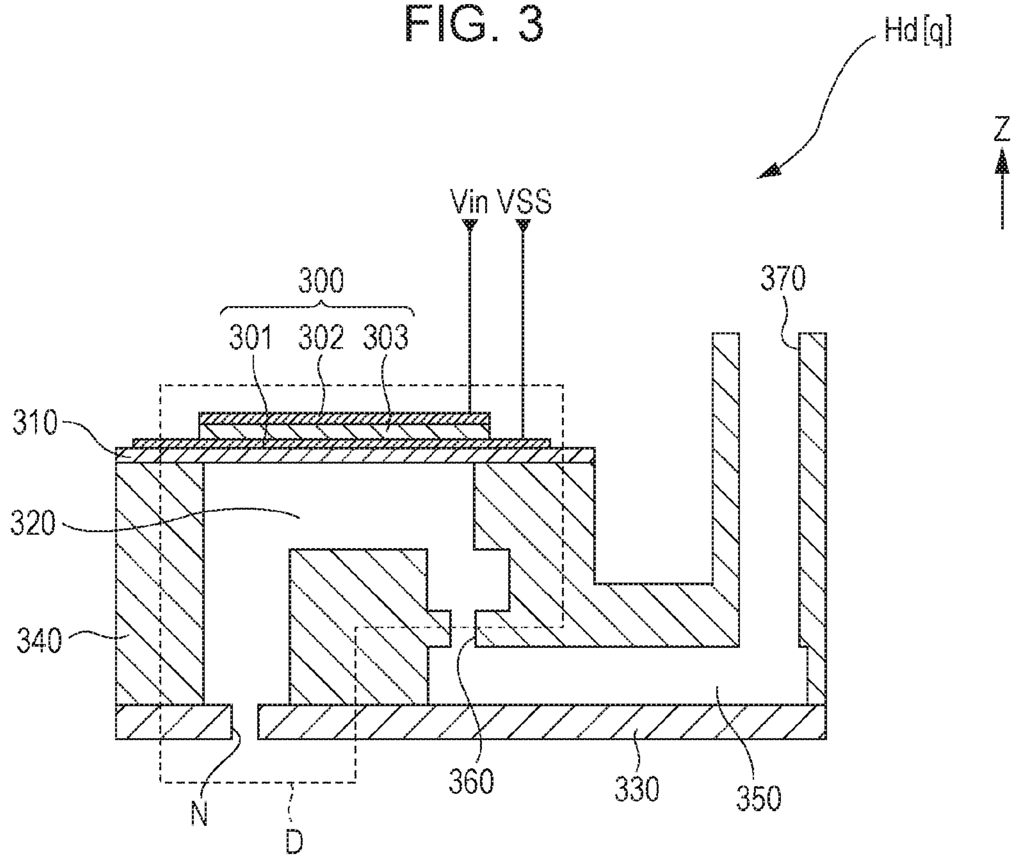
FIG. 3 is a schematic sectional view of a recording head.
Figure 4A:
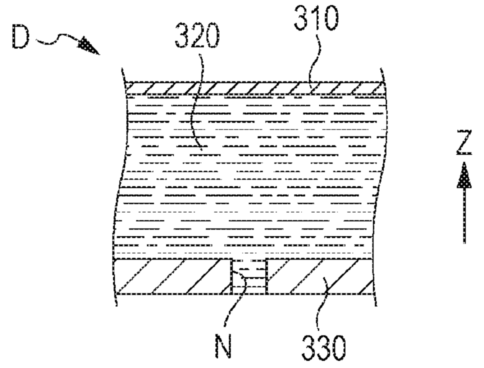
FIGS. 4A to 4C are illustrative diagrams showing changes of the sectional shape of a discharge portion when an individual drive signal is supplied.
Figure 4B:
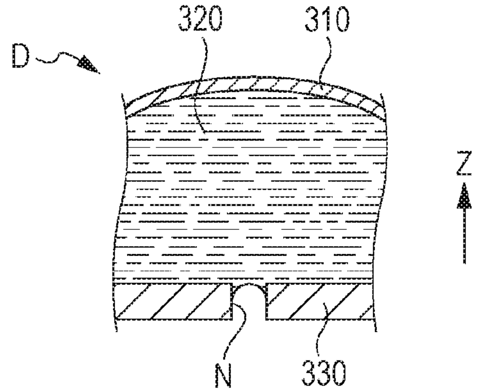
Figure 4C:
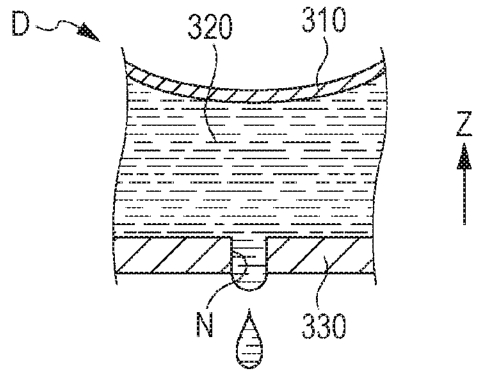
Figure 5:
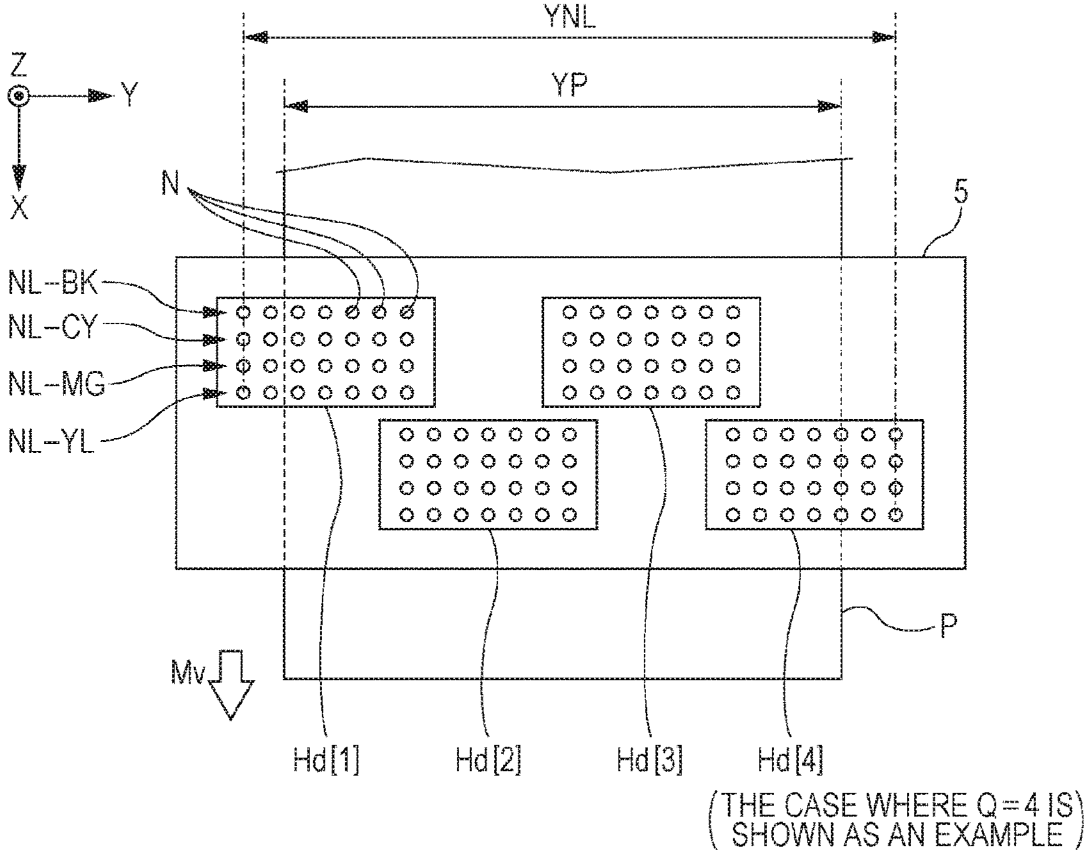
FIG. 5 is a plan view showing an example of an arrangement of nozzles in a head module.

With reference to FIGS. 3 to 5, the recording head Hd[q] and the discharge portions D and the nozzles N provided in the recording head Hd[q] will be described.

FIG. 3 is an example schematic partial sectional view of the recording head Hd[q]. This drawing, for convenience in illustration, shows one discharge portion D of the M number of discharge portions D[q][1] to D[q][M] provided in the recording head Hd[q], a reservoir 350 that communicates with the discharge portion D through an ink supply opening 360, and an ink inlet opening 370 for supplying the ink from the ink cartridge 31 to the reservoir 350.

As shown in FIG. 3, the discharge portion D includes a piezoelectric element 300, a cavity 320 (an example of a "pressure chamber") capable of having the ink charged therein, a nozzle N that communicates with the cavity 320, and a vibration plate 310. The discharge portion D discharges the ink out of the cavity 320 through the nozzle N as the piezoelectric element 300 is driven by the individual drive signal Vin. The cavity 320 of the discharge portion D is a space defined by a cavity plate 340 formed into a predetermined shape that has a recess portion, a nozzle plate 330 provided with the nozzle N, and the vibration plate 310. The cavity 320 communicates with the reservoir 350 through the ink supply opening 360. The reservoir 350 communicates with the correspond one of the ink cartridges 31 through the ink inlet opening 370.

In the exemplary embodiment, the piezoelectric element 300 is, for example, a unimorph (monomorph) type piezoelectric element as shown in FIG. 3. The piezoelectric element 300 may be not only of the unimorph type but also of a bimorph type, a stacked type, etc.

The piezoelectric element 300 includes a lower electrode 301, an upper electrode 302, and a piezoelectric body 303 provided between the lower electrode 301 and the upper electrode 302. When a voltage is applied between the lower electrode 301 and the upper electrode 302 due to the setting of the electric potential of the lower electrode 301 at a predetermined reference electric potential VSS and supply of the individual drive signal Vin to the upper electrode 302, the piezoelectric element 300 bends (is displaced) in up-down directions in FIG. 3 according to the applied voltage and therefore vibrates.

On an upper surface opening portion of the cavity plate 340, the vibration plate 310 has been placed and the lower electrode 301 has been joined to the vibration plate 310. Therefore, when the piezoelectric element 300 vibrates due to the individual drive signal Vin, the vibration plate 310 also vibrates. Then, as the vibration plate 310 vibrates, the volume of the cavity 320 (the pressure in the cavity 320) changes so that the ink held in the cavity 320 is discharged out through the nozzle N. When the amount of the ink in the cavity 320 is reduced as the ink is discharged, the ink is supplied into the cavity 320 from the reservoir 350. The reservoir 350 is supplied with the ink from the ink cartridge 31 through the ink inlet opening 370.

FIGS. 4A to 4C are illustrative diagrams for describing an operation of discharging the ink from the discharge portion D. For example, during a state shown in FIG. 4A, the head driver DR changes the electric potential of the individual drive signal Vin supplied to the piezoelectric element 300 of the discharge portion D so as to cause a strain in the piezoelectric element 300 such that the vibration plate 310 of the discharge portion D is bent in the +Z direction. As a result, as shown in FIG. 4B, the volume of the cavity 320 of the discharge portion D increases in comparison with that volume thereof indicated in FIG. 4A. Next, for example, the head driver DR, during the state shown in FIG. 4B, changes the electric potential of the individual drive signal Vin so as to displace the vibration plate 310 in the −Z direction beyond the position of the vibration plate 310 in the state shown in FIG. 4A so that the volume of the cavity 320 is rapidly reduced as shown in FIG. 4C. Because of the compression pressure occurring in the cavity 320, a portion of the ink filling the cavity 320 is discharged, as an ink droplet, through the nozzle N communicating with the cavity 320.

FIG. 5 is a plan view of an interior of the ink jet printer 1 taken in the +Z direction or the −Z direction (the +Z direction and the −Z direction will hereinafter be collectively referred to as "Z-axis directions"), illustrating an example of an arrangement of the (Q×M) number of nozzles N in total provided in the Q number of recording heads Hd[1] to Hd[Q] provided in the head module 5. In some of the drawings referred to below, a case where Q=4 is shown as an example for convenience in illustration. That is, a case where the ink jet printer 1 includes four head units HU[1] to HU[4] will sometimes be shown as an example below.

As shown in FIG. 5, each recording head Hd[q] is provided with four nozzle arrays NL made up of a nozzle array NL-BK made up of a plurality of nozzles N, a nozzle array NL-CY made up of a plurality of nozzles N, a nozzle array NL-MG made up of a plurality of nozzles N, and a nozzle array NL-YL made up of a plurality of nozzles N. Incidentally, in each recording head Hd[q], the nozzles N of the nozzle array NL-BK are nozzles N provided in the discharge portion D that discharges the black ink, the nozzles N of the nozzle array NL-CY are nozzles N provided in the discharge portion D that discharges the cyan ink, the nozzles N of the nozzle array NL-MG are nozzles N provided in the discharge portion D that discharges the magenta ink, and the nozzles N of the nozzle array NL-YL are nozzles N provided in the discharge portion D that discharges the yellow ink. The four nozzle arrays NL are provided so that in a plan view, the nozzle arrays NL extend in a +Y direction or a −Y direction (hereinafter, the +Y direction and the −Y direction will be collectively referred to as "Y-axis directions").

A region in the head module 5 in which the (Q×M) number of nozzles N that correspond to the (Q×M) number of discharge portions D are provided lies in a range YNL in the Y-axis directions. The range YNL is larger than or equal to a range YP in the Y-axis directions that the recording sheet P that is subjected to printing has (more precisely, the range YP of a recording sheet P having a maximum width in the Y-axis directions over which the ink jet printer 1 is able to carry out printing).

Incidentally, the arrangement of the Q number of recording heads Hd[1] to Hd[Q] and the arrangement of the individual nozzle arrays NL in each recording head Hd[q] shown in FIG. 5, that is, the arrangement of the (Q×M) number of nozzles N in the head module 5 shown in FIG. 5, is a mere example and the recording heads Hd[1] to Hd[Q] and the nozzle arrays NL may be disposed in any manner. For example, although in FIG. 5, the nozzle arrays NL extend in the Y-axis directions, the individual nozzle arrays NL may extend in any direction in the XY plane. For example, the individual nozzle arrays NL may extend in a direction different from the Y-axis directions, the +X direction, and the −X direction (hereinafter, the +X direction and the −X direction will be collectively referred to as "X-axis directions"), that is, in an oblique direction in FIG. 5. Furthermore, although in FIG. 5, the plurality of nozzles N that constitute the nozzles arrays NL are arranged so as to align in the Y-axis directions, the nozzles N may be disposed in a so-called staggered pattern in which the even-numbered nozzles N and the odd-numbered nozzles N from the −Y side are shifted from each other in the position in the X-axis directions.

Furthermore, although in the exemplary embodiment, the Q number of recording heads Hd[1] to Hd[Q] are each provided with M number of discharge portions D, the invention is not limited to this arrangement. That is, of the Q number of recording heads Hd[1] to Hd[Q], one or more recording heads Hd may be provided with a number of discharge portions D different from the number of discharge portions D provided in another recording head Hd.

3. Configuration and Operation of Head Drivers

Next, configuration and operation of the head drivers DR will be described with reference to FIGS. 6 to 9.

3.1. Head Driver

Figures 6, 7:
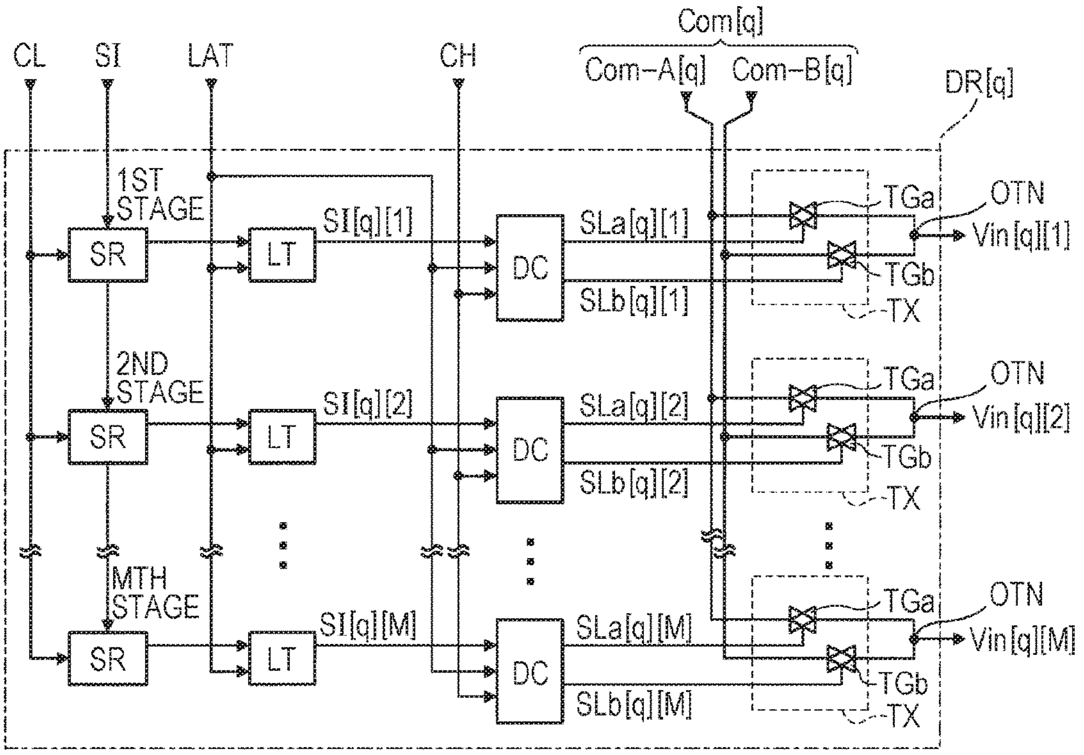
FIG. 6 is a diagram showing a configuration of a head driver.
FIG. 7 is an illustrative diagram showing the content of decoding by a decoder.

FIG. 6 is a block diagram showing a configuration of a head driver DR[q]. As shown in FIG. 6, the head driver DR[q] includes M number of sets each made up of a shift register SR, a latch circuit LT, a decoder DC, and a switching portion TX. The M number of sets correspond one-to-one to the M number of discharge portions D[q][1] to D[q][M] of the head driver DR[q]. In the following description, the M number of sets will sometimes be individually referred to as first state, second stage, . . . , Mth stage in order from the top in FIG. 6. Furthermore, each of the elements of the mth stage will sometimes be represented by the aforementioned sign that represents that element combined with a suffix [m] representing the ordinal number m of the stage.

The head driver DR[q] is supplied with a clock signal CL, the print signal SI[q], a latch signal LAT, a change signal CH, and the drive signal Com[q] from the control portion 6.

As stated above, the drive signal Com[q] supplied to the head driver DR[q] contains the drive signals Com-A[q] and Com-B[q]. The drive signals Com-A[q] and Com-B[q] have a waveform for driving the discharge portions D.

The print signal SI[q], as stated above, is a digital signal that determines an amount of ink that each of the discharge portions D[q][1] to D[q][M] needs to discharge, and contains print signals SI[q][1] to SI[q][M]. Of these signals, the print signal SI[q][m] designates whether there is ink discharge to be performed by the discharge portion D[q][m] and the amount of ink that the discharge portion D[q][m] needs to discharge, in two bits that are a higher-order bit b1 and a lower-order bit b2. Concretely, the print signal SI[q][m] designates to the discharge portion D[q][m] one of the discharge of an amount of ink that corresponds to a large dot, the discharge of an amount of ink that corresponds to a medium-sized dot, the discharge of an amount of ink that corresponds to a small dot, and the non-discharge of ink (see FIG. 7).

The head driver DR[q] supplies the discharge portion D[q][m] with the individual drive signal Vin[q][m] that contains a waveform designated by the print signal SI[q][m].

The shift register SR of the mth stage temporarily holds, of the print signal SI[q], the print signal SI[q][m] that is a two-bit signal that corresponds to the discharge portion D[q][m]. The shift registers SR of the first to (M−1)th stages transfer the print signal SI[q] sequentially to the subsequent-stage shift registers SR in accordance with the clock signal CL. Then, when the print signal SI[q] has been transferred to the shift register SR of the Mth stage, that is, when, of the print signal SI[q], the print signal SI[q][M] that determines the amount of ink to be discharged from the discharge portion D[q][M] of the Mth stage is transferred to the shift register SR[q][M] of the Mth stage, the shift registers SR[q][1] to SR[q][M] temporarily hold the transferred two-bit print signals SI[q][1] to SI[q][M], respectively.

The M number of latch circuits LT of the first to Mth stages latch the two-bit print signals SI[q][1] to SI[q][M] (that correspond to the individual stages) held by the M number of shift registers SR of the first to Mth stages, respectively, in concert at a timing at which the latch signal LAT rises.

An operation period that is a period during which the ink jet printer 1 executes the print process is made up of a plurality of unit periods Tu.

The control portion 6 supplies to the head driver DR[q] the print signal SI[q] in every unit period Tu and also supplies thereto a latch signal LAT that causes the latch circuits LT to latch the print signals SI[q][m] in every unit period Tu. Furthermore, the control portion 6 supplies the drive signal generation portion GR[q] with the definition signal dCom[q] (the definition signals dCom-A[q] and dCom-B[q]) and the clock signal CL and thereby controls the operation of the drive signal generation portion GR[q] so that the drive signal generation portion GR[q] supplies the drive signal Com[q] (the drive signals Com-A[q] and Com-B[q]) to the head driver DR[q] in every unit period Tu. Thus, the control portion 6 controls the operation of the head driver DR[q] so that, during each unit period Tu, the discharge portion D[q][m] executes one of the discharge of the amount of ink that corresponds to the large dot, the discharge of the amount of ink that corresponds to the medium-sized dot, and the discharge of the amount of ink that corresponds to the small dot, or the non-discharge of ink.

Incidentally, in the exemplary embodiment, the control portion 6 segments each unit period Tu into a control period Ts1 and a control period Ts2 by using the change signal CH. In this exemplary embodiment, it is assumed that the control periods Ts1 and Ts2 have equal lengths of time. In the following description, the control periods Ts1 and Ts2 will sometimes be collectively referred to as control periods Ts.

Each decoder DC decodes the print signal SI[q][m] latched by the latch circuit LT and outputs a select signal SL[q][m]. In this exemplary embodiment, the select signal SL[q][m] contains a select signal SLa[q][m] for selecting the drive signal Com-A[q] and a select signal SLb[q][m] for selecting the drive signal Com-B[q].

FIG. 7 is an illustrative diagram showing a content of the decoding performed by the decoder DC of the mth stage. As shown in this diagram, the decoder DC of the mth stage outputs the select signal SL[q][m] in each of the control periods Ts1 and Ts2 of each unit period Tu. For example, when the print signal SI[q][m] supplied during a unit period Tu is (b1, b2)=(1, 0), the decoder DC of the mth stage, during the control period Ts1, sets the select signal SLa[q][m] to an H level and the select signal SLb[q][m] to an L level and, during the control period Ts2, sets the select signal SLb[q][m] to the H level and the select signal SLa[q][m] to the L level.

As shown in FIG. 6, the head driver DR[q] includes the M number of switching portions TX corresponding one-to-one to the M number of discharge portions D[q][1] to D[q][M]. Each switching portion TX includes a transmission gate TGa and a transmission gate TGb. Of these transmission gates, the transmission gate TGa[m] provided in the switching portion TX[m] of the mth stage turns on when the select signal SLa[q][m] is at the H level, and turns off when the select signal SLa[q][m] is at the L level. Furthermore, the transmission gate TGb[m] provided in the switching portion TX[m] of the mth stage turns on when the select signal SLb[q][m] is at the H level, and turns off when the select signal SLb[q][m] is at the L level.

For example, when the print signal SI[q][m] represents (1, 0) (see FIG. 7), the transmission gate TGa[m] is turned on and the transmission gate TGb[m] is turned off during the control period Ts1, and the transmission gate TGa[m] is turned off and the transmission gate TGb[m] is turned on during the control period Ts2.

As shown in FIG. 6, one end of the transmission gate TGa[m] is supplied with the drive signal Com-A[q] and one end of the transmission gate TGb[m] is supplied with the drive signal Com-B[q]. Furthermore, another end of each of the transmission gates TGa[m] and TGb[m] is electrically connected to an output end OTN of the mth stage.

Furthermore, in the exemplary embodiment, as shown in FIG. 6, during each control period Ts, the switching portion TX[m] is controlled so that one of the transmission gates TGa[m] and TGb[m] is on and the other is off. That is, during each control period Ts, the switching portion TX[m] supplies one of the drive signals Com-A[q] and Com-B[q] as the individual drive signal Vin[q][m] to the discharge portion D[q][m] through the output end OTN of the mth stage.

3.2. Drive Signal

Figure 8:
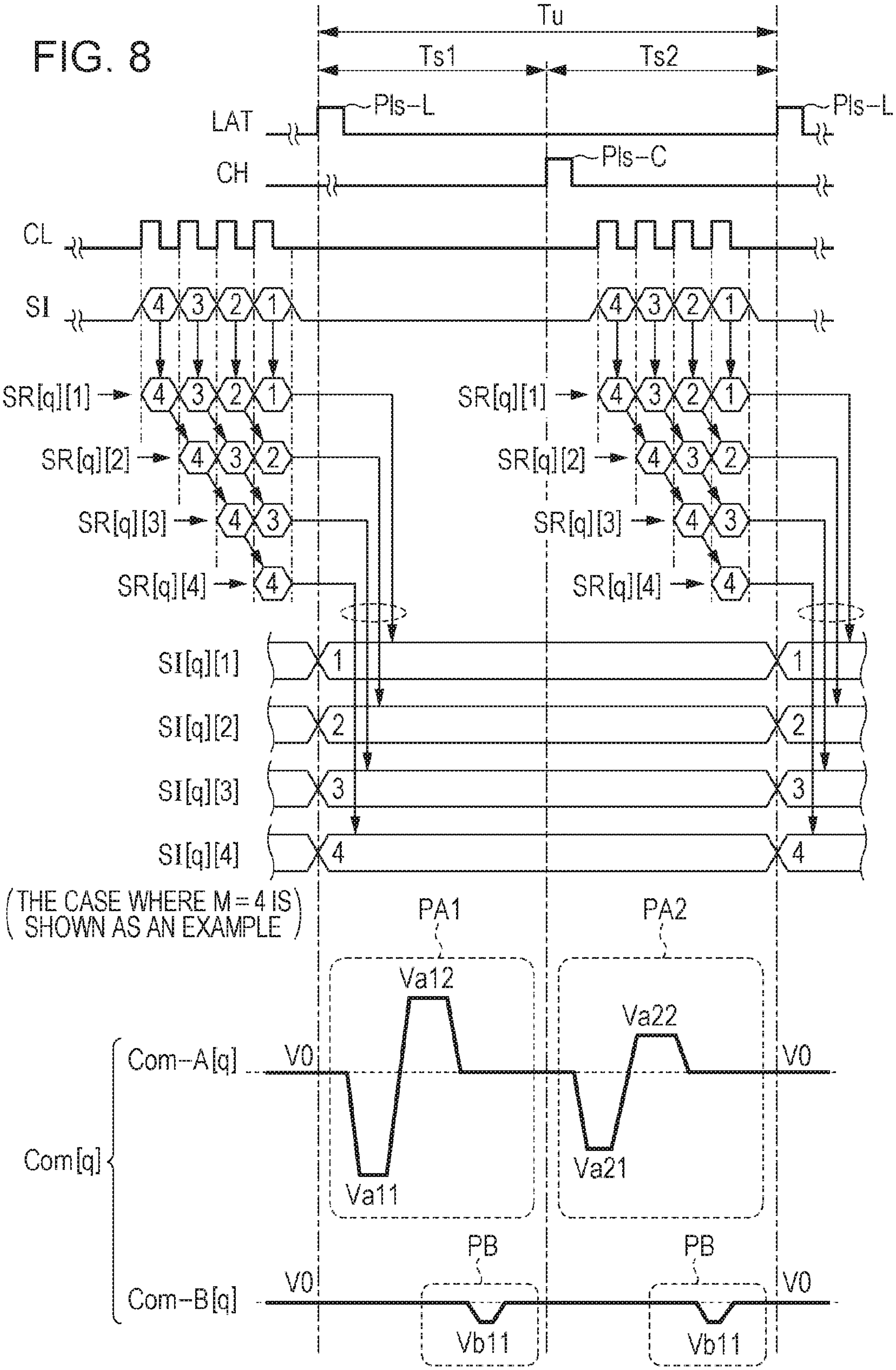
FIG. 8 is a timing chart showing an operation of the head driver.

FIG. 8 is a timing chart for describing various signals that the control portion 6 and the drive module 8 supply to the head driver DR[q] during each unit period Tu and operations that the head driver DR[q] perform during the same unit period Tu. Note that FIG. 8 shows the case where M=4 as an example for convenience in illustration.

As shown in FIG. 8, the unit period Tu is defined (segmented) by a pulse Pls-L contained in the latch signal LAT and the control periods Ts1 and Ts2 are defined (segmented) by the pulse Pls-L and a pulse Pls-C contained in the change signal CH.

The control portion 6, prior to start of each unit period Tu, supplies the print signal SI[q] to the head driver DR[q] after synchronizing the print signal SI[q] with the clock signal CL. Then, the shift registers SR of the head driver DR[q] transfer the supplied print signal SI[q] sequentially to the subsequent stages in accordance with the clock signal CL.

As exemplified in FIG. 8, the drive signal Com-A[q] that the drive signal generation circuit GR-A[q] of the drive signal generation portion GR[q] outputs during each unit period Tu has a discharge waveform PA1 that is provided in the control period Ts1 and a discharge waveform PA2 that is provided in the control period Ts2.

The discharge waveform PA1 is a waveform such that when the individual drive signal Vin[q][m] containing the discharge waveform PA1 is supplied to the discharge portion D[q][m], the discharge portion D[q][m] discharges an intermediate amount of ink that corresponds to the medium-sized dot.

The discharge waveform PA2 is a waveform such that when the individual drive signal Vin[q][m] containing the discharge waveform PA2 is supplied to the discharge portion D[q][m], the discharge portion D[q][m] discharges a small amount of ink that corresponds to the small dot.

For example, an electric potential difference between the lowest potential of the discharge waveform PA1 (electric potential Va11 in this example) and the highest potential thereof (electric potential Va12 in this example) is greater than the potential difference between the lowest potential of the discharge waveform PA2 (electric potential Va21 in this example) and the highest potential thereof (electric potential Va22 in this example).

As exemplified in FIG. 8, the drive signal Com-B[q] that the drive signal generation circuit GR-B[q] of the drive signal generation portion GR[q] outputs during each unit period Tu contains microvibration waveforms PB.

Each microvibration waveform PB is a waveform such that when the individual drive signal Vin[q][m] containing the microvibration waveform PB is supplied to the discharge portion D[q][m], the discharge portion D[q][m] does not discharge ink. That is, the microvibration waveform PB is a waveform for giving microvibration to the ink within the discharge portion D and therefore preventing viscosity increase of the ink. For example, the microvibration waveform PB is predetermined so that the potential difference between the lowest potential of the microvibration waveform PB (electric potential Vb11 in this example) and the highest potential thereof (reference electric potential V0 in this example) is smaller than the potential difference in the discharge waveform PA2 between its lowest and highest potentials.

3.3. Individual Drive Signal

Figure 9:
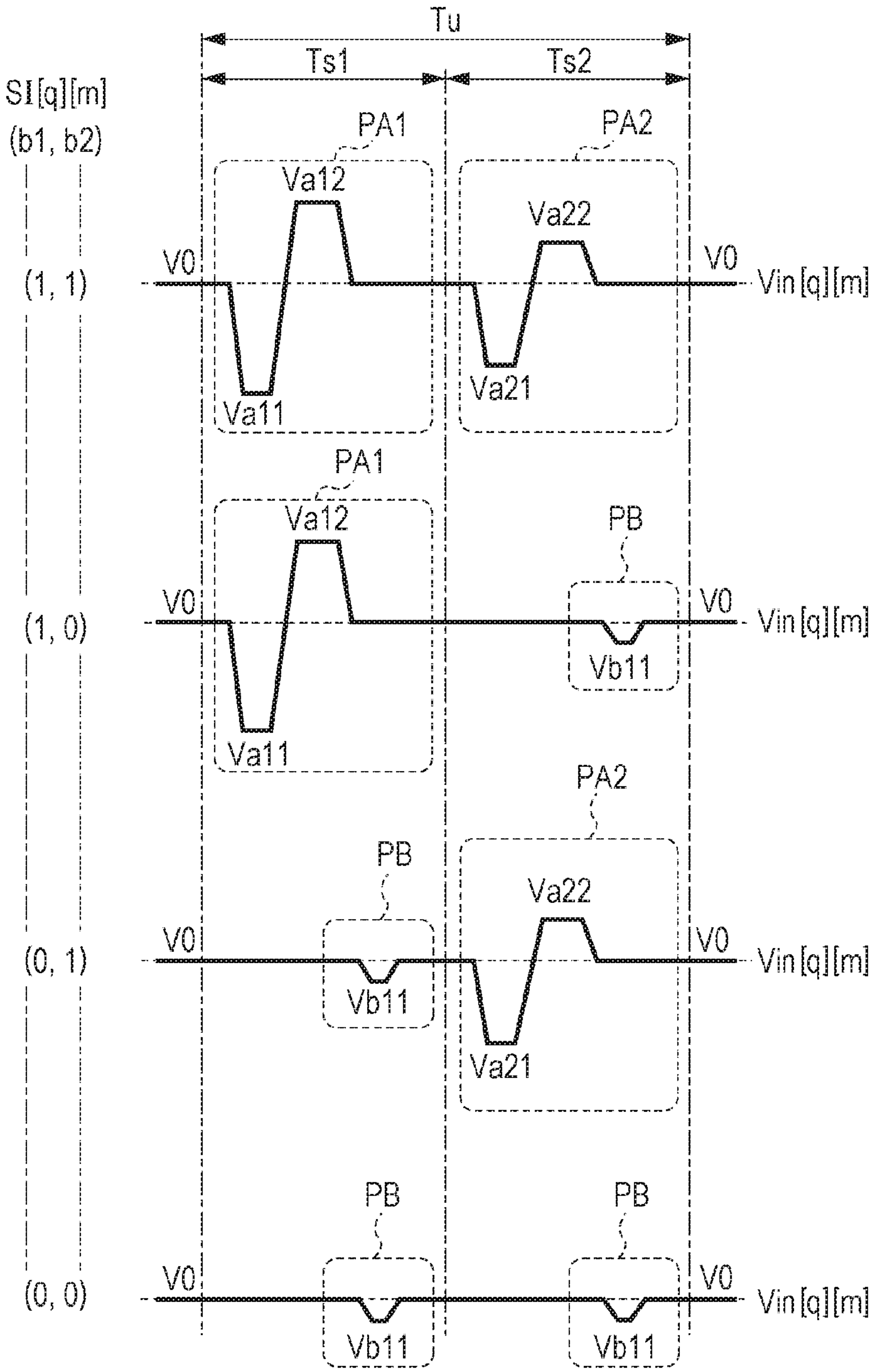
FIG. 9 is a timing chart showing waveforms of an individual drive signal.

Next, with reference to FIG. 9, the individual drive signal Vin[q][m] that the head driver DR[q] outputs during a unit period Tu will be described.

In the case where the print signal SI[q][m] supplied to the head driver DR[q] during the unit period Tu represents (1, 1), the switching portion TX[m], during the control period Ts1, selects the drive signal Com-A[q] and outputs the individual drive signal Vin[q][m] containing the discharge waveform PA1 and, during the control period Ts2, selects the drive signal Com-A[q] and outputs the individual drive signal Vin[q][m] containing the discharge waveform PA2. Therefore, in this case, as shown in FIG. 9, the individual drive signal Vin[q][m] supplied to the discharge portion D[q][m] during the unit period Tu contains the discharge waveform PA1 and the discharge waveform PA2. As a result, during this unit period Tu, the discharge portion D[q][m] discharges the intermediate amount of ink based on the discharge waveform PA1 and the small amount of ink based on the discharge waveform PA2, and the ink discharged by these two discharging operations forms a large dot on the recording sheet P.

In the case where the print signal SI[q][m] supplied to the head driver DR[q] during a unit period Tu represents (1, 0), the switching portion TX[m], during the control period Ts1, selects the drive signal Com-A[q] and outputs the individual drive signal Vin[q][m] containing the discharge waveform PA1 and, during the control period Ts2, selects the drive signal Com-B[q] and outputs the individual drive signal Vin[q][m] containing the microvibration waveform PB. Therefore, in this case, as shown in FIG. 9, the individual drive signal Vin[q][m] supplied to the discharge portion D[q][m] during the unit period Tu contains the discharge waveform PA1 and the microvibration waveform PB. As a result, during this unit period Tu, the discharge portion D[q][m] discharges the intermediate amount of ink based on the discharge waveform PA1 to form a medium-sized dot on the recording sheet P.

In the case where the print signal SI[q][m] supplied to the head driver DR[q] during a unit period Tu represents (0, 1), the switching portion TX[m], during the control period Ts1, selects the drive signal Com-B[q] and outputs the individual drive signal Vin[q][m] containing the microvibration waveform PB and, during the control period Ts2, selects the drive signal Com-A[q] and outputs the individual drive signal Vin[q][m] containing the discharge waveform PA2. Therefore, in this case, as shown in FIG. 9, the individual drive signal Vin[q][m] supplied to the discharge portion D[q][m] during the unit period Tu contains the discharge waveform PA2 and the microvibration waveform PB. As a result, during this unit period Tu, the discharge portion D[q][m]

discharges the small amount of ink based on the discharge waveform PA2 to form a small dot on the recording sheet P.

In the case where the print signal SI[q][m] supplied to the head driver DR[q] during a unit period Tu represents (0, 0), the switching portion TX[m], during each of the control periods Ts1 and Ts2, selects the drive signal Com-B[q] and outputs the individual drive signal Vin[q][m] containing the microvibration waveform PB. Therefore, in this case, as shown in FIG. 9, the individual drive signal Vin[q][m] supplied to the discharge portion D[q][m] during the unit period Tu contains two microvibration waveforms PB. As a result, during this unit period Tu, the discharge portion D[q][m] does not discharge ink and therefore a dot is not formed on the recording sheet P (resulting in non-recording).

4. Drive Module

Next, with reference to FIGS. 10 to 14, the drive module 8 will be described.

4.1. Connection Between Drive Module and Head Module

Figure 10:
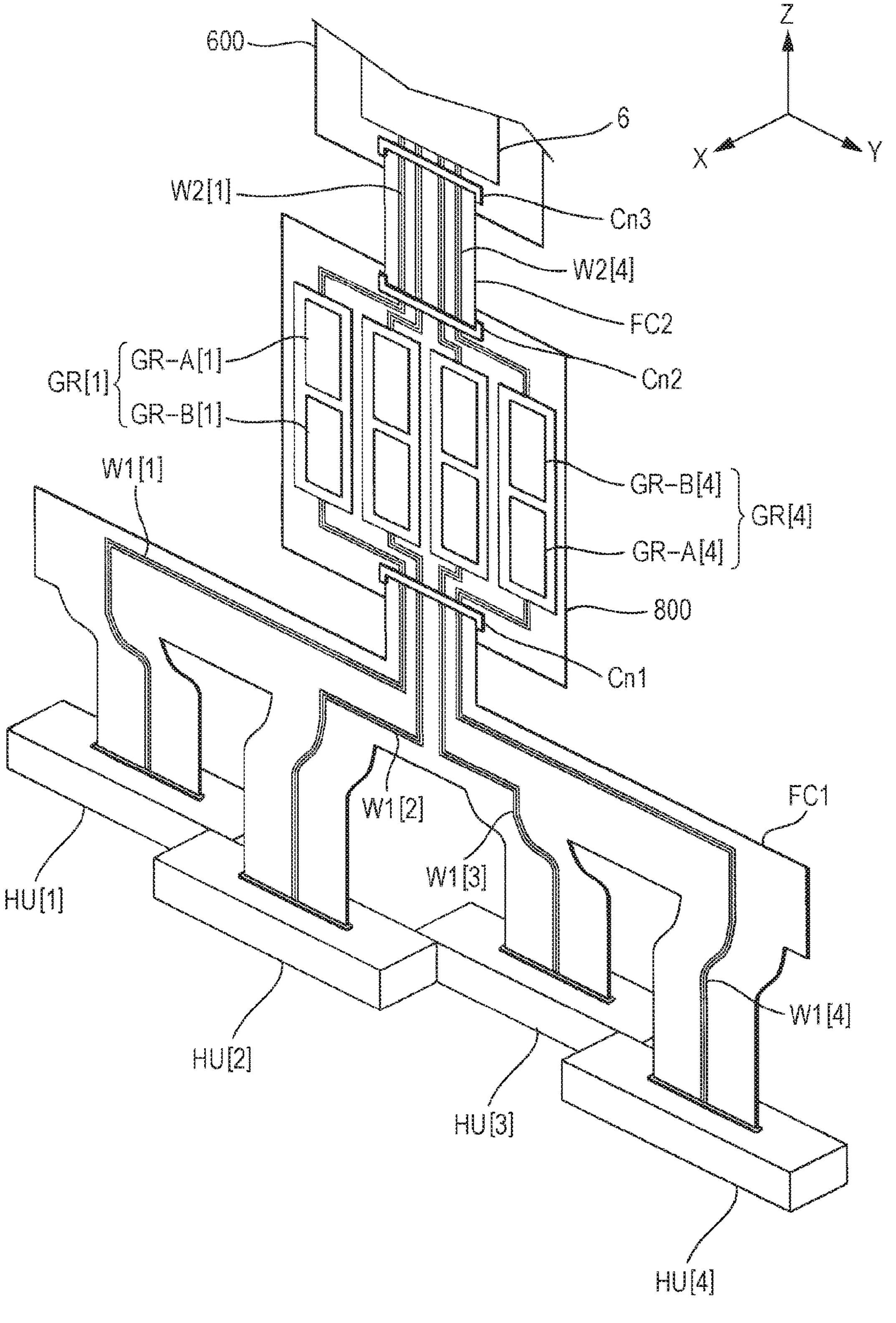
FIG. 10 is a diagram showing connection between circuit substrates in the ink jet printer.

FIG. 10 is a diagram showing an example of electrical connection between the drive module 8 and the head units HU and electrical connection between the drive module 8 and the control portion 6. Note that FIG. 10 illustrates the case where Q=4 as an example.

As shown in FIG. 10, the Q number of drive signal generation portions GR[1] to GR[Q] that the drive module 8 has are provided on a drive board 800. The control portion 6 is provided on a control board 600. The Q number of head units HU[1] to HU[Q] of the head module 5 are individually connected to the drive board 800 by a flexible printed board FC1. Furthermore, the drive board 800 and the control board 600 are connected by a flexible printed board FC2.

Although in this exemplary embodiment, the connection between the head unit HU[q] and the drive board 800 and the connection between the drive board 800 and the control board 600 are made by flexible printed boards, the connections therebetween may also be realized by, for example, flexible flat cables or other types of cables. Furthermore, although in the exemplary embodiment, the drive module 8 is provided outside the head module 5, the drive module 8 may also be mounted in the head module 5.

As shown in FIG. 10, a drive signal generation portion GR[q] is electrically connected to the head unit HU[q] via a connector Cn1 provided on the drive board 800 and a wiring portion W1[q] provided on the flexible printed board FC1. Furthermore, the drive signal generation portion GR[q] is electrically connected to the control portion 6 via a connector Cn2 provided on the drive board 800, a wiring portion W2[q] provided on the flexible printed board FC2, and a connector Cn3 provided on the control board 600.

As stated above, the drive signal generation portion GR[q] includes the drive signal generation circuits GR-A[q] and GR-B[q]. The wiring portion W1[q] includes wiring for electrically connecting the drive signal generation circuit GR-A[q] and the head unit HU[q] and wiring for electrically connecting the drive signal generation circuit GR-B[q] and the head unit HU[q]. Likewise, the wiring portion W2[q] includes wiring for electrically connecting the drive signal generation circuit GR-A[q] and the control portion 6 and wiring for electrically connecting the drive signal generation circuit GR-B[q] and the control portion 6.

4.2. Configuration and Operation of Drive Signal Generation Portion

Figure 11:
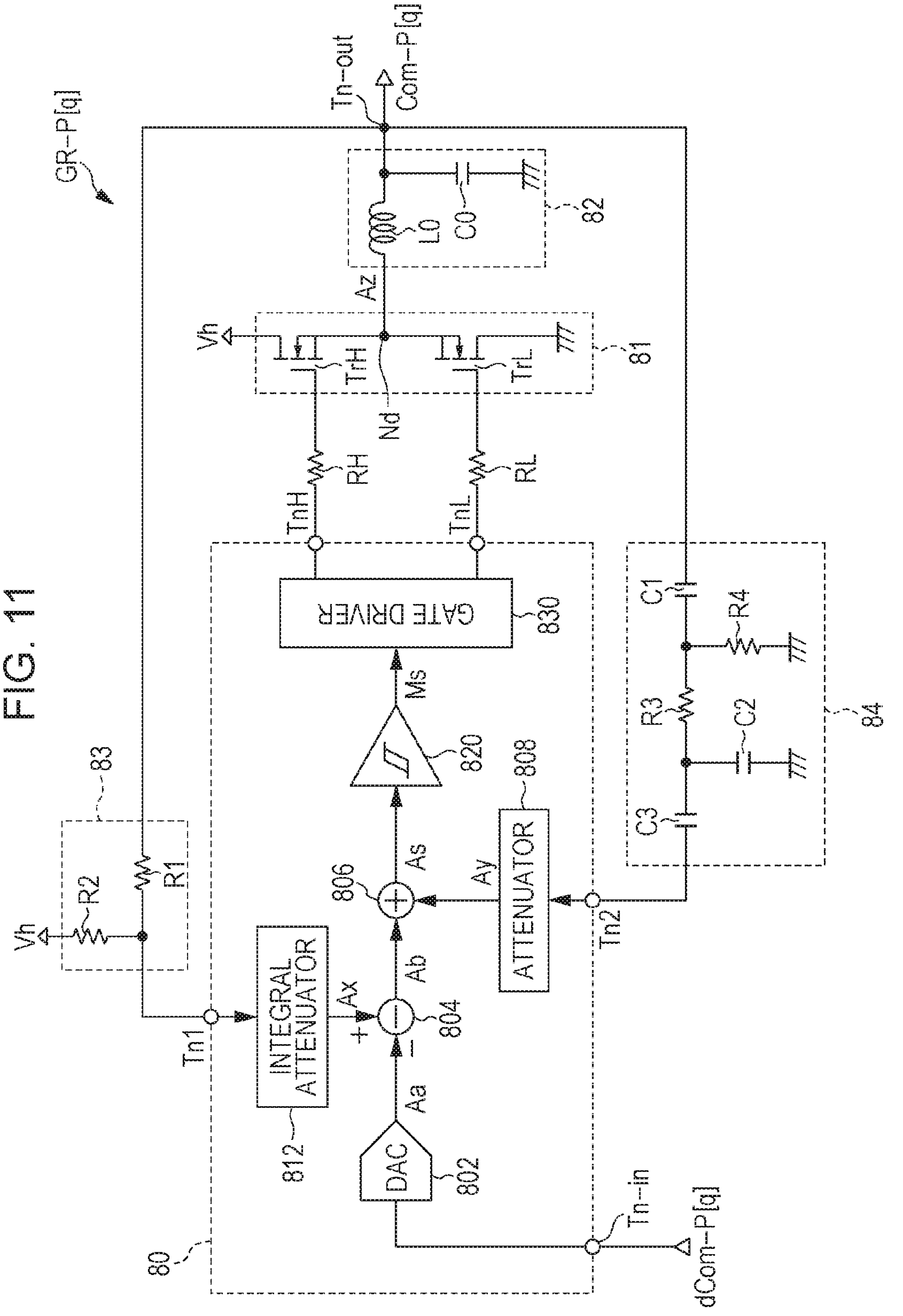
FIG. 11 is a diagram showing a configuration of a drive signal generation circuit.

FIG. 11 is a diagram showing a circuit configuration of one of the two drive signal generation circuits GR-P[q] provided in the drive signal generation portion GR[q]. As shown in this diagram, the drive signal generation circuits GR-P[q] generate the drive signals Com-P[q] on the basis of the definition signals dCom-P[q]. As stated above, the drive signal generation circuits GR-P[q] is a term to collectively refer to the drive signal generation circuits GR-A[q] and GR-B[q]. That is, FIG. 11 illustrates the drive signal generation circuit GR-A[q] that generates the drive signal Com-A[q] on the basis of the definition signal dCom-A[q] and the drive signal generation circuit GR-B[q] that generates the drive signal Com-B[q] on the basis of the definition signal dCom-B[q].

Each drive signal generation circuit GR-P[q] firstly converts the digital definition signal dCom-P[q] supplied from the control portion 6 into an analog signal. Secondly, the drive signal generation circuit GR-P[q] feeds back the output drive signal Com-P[q], corrects the deviation of a signal (attenuated signal) based on the drive signal Com-P[q] from a target signal by a high-frequency component of the drive signal Com-P[q], and generates a modulated signal according to the corrected signal. Thirdly, the drive signal generation circuit GR-P[q] generates an amplified signal by switching transistors in accordance with the modulated signal. Fourthly, the drive signal generation circuit GR-P[q] smooths (demodulates) the amplified signal by using a low-pass filter and outputs the smoothed signal as a drive signal Com-P[q].

A configuration of each drive signal generation circuit GR-P[q] will be described below.

As shown in FIG. 11, each drive signal generation circuit GR-P[q] includes an LSI (large-scale integration) 80, transistors TrH and TrL, and other various elements such as resistors and capacitors.

As shown in FIG. 11, the LSI 80 receives the definition signal dCom-P[q] (the definition signal dCom-A[q] or dCom-B[q]) from the control portion 6 via an input terminal Tn-in. On the basis of the definition signal dCom-P[q], the LSI 80, for example, inputs a gate signal to the gate of each of the transistors TrH and TrL. Note that, in this exemplary embodiment, it is assumed as an example that the transistors TrH and TrL are N-channel type FETs (field effect transistors).

As shown in FIG. 11, the LSI 80 includes a DAC (digital-to-analog converter) 802, a subtractor 804, an adder 806, an attenuator 808, an integral attenuator 812, a comparator 820, and a gate driver 830.

The DAC 802 converts the definition signal dCom-P[q] that defines the waveform of the drive signal Com-P[q] into an analog signal Aa and supplies the signal Aa to an input end (−) of the subtractor 804. Note that the voltage amplitude of the signal Aa is, for example, about 0 to about volts, and this voltage is amplified about 20 times to make the drive signal Com-P[q]. That is, the signal Aa is a signal that is a target before amplification of the drive signal Com-P[q].

The integral attenuator 812 supplies an input end (+) of the subtractor 804 with a signal Ax obtained by attenuating and then integrating the drive signal Com-P[q] fed back via the terminal Tn1.

The subtractor 804 supplies the adder 806 with a signal Ab that indicates a voltage obtained by subtracting the voltage at the input end (−) from the voltage at the input end (+).

Incidentally, the power supply voltage across a circuit extending from the DAC 802 to the comparator 820 is 3.3 volts with a small amplitude. That is, the voltage of the signal Aa is about 2 volts at maximum. On the other hand, the voltage of the drive signal Com-P[q] sometimes exceeds 40 volts. Therefore, in the integral attenuator 812, the voltage of the drive signal Com-P[q] is attenuated so that the amplitude range of the signal Ax is made to agree with the amplitude range of the signal over the circuit from the DAC 802 to the comparator 820.

The attenuator 808 supplies the adder 806 with a signal Ay obtained by attenuating the high-frequency component of the drive signal Com-P[q] fed back via a terminal Tn2. The attenuation by the attenuator 808, similar to the attenuation by the integral attenuator 812, is performed to make the amplitude range of the signal Ay to agree with the amplitude range of the signal over the circuit extending from the DAC 802 to the comparator 820.

The adder 806 supplies the comparator 820 with a signal As that indicates a voltage obtained by summing the voltage indicated by the signal Ab and the voltage indicated by the signal Ay. The voltage of the signal As is a voltage obtained by subtracting the voltage of the signal Aa from the attenuated voltage of the signal supplied to the terminal Tn1 and adding to the difference voltage the attenuated voltage of the signal supplied to the terminal Tn2. Therefore, the voltage of the signal As can be said to be a signal in which the deviation of the attenuated voltage of the drive signal Com-P[q] output from an output terminal Tn-out from the voltage of the signal Aa that is a target has been corrected with the high-frequency component of the drive signal Com-P[q].

The comparator 820 outputs a modulated signal Ms obtained by pulse-modulating the signal As. Concretely, the comparator 820 outputs the modulated signal Ms that turns to the H level when the voltage of the signal As increases to or above a threshold value voltage Vth1 and that turns to the L level when the voltage of the signal As deceases to or below a threshold value voltage Vth2. Incidentally, the threshold value voltages Vth1 and Vth2 have been set so that "Vth1>Vth2".

The gate driver 830 is supplied with the modulated signal Ms. The gate driver 830 supplies a gate signal obtained by converting the modulated signal Ms to a large-logic amplitude signal to the gate electrode of the transistor TrH via a terminal TnH and a resistor RH, and supplies a gate signal obtained by converting a signal whose logic level has been inverted from the modulated signal Ms into a large-logic amplitude signal to the gate electrode of the transistor TrL via a terminal TnL and a resistor RL. Therefore, the logic levels of the gate signals supplied to the gate electrodes of the transistors TrH and TrL are mutually exclusive. Incidentally, timing may be controlled so that the logic levels of the two gate signals that the gate driver 830 outputs do not simultaneously become the H level. Specifically, being exclusive herein means that the logic levels of the gate signals supplied to the gate electrodes of the transistors TrH and TrL do not become the H level simultaneously (i.e., the transistors TrH and TrL do not become on simultaneously).

Note that the modulated signal Ms in this exemplary embodiment is an example. It suffices that the modulated signal is a signal that drives the transistors TrH and TrL according to the definition signal dCom-P[q]. That is, the modulated signal in this exemplary embodiment is not limited to a modulated signal Ms that is a modulated signal in a strict sense but includes a signal obtained by inverting the logic level of the modulated signal Ms and a signal controlled in timing so that the transistors TrH and TrL do not simultaneously turn on.

Hereinafter, a circuit for generating a modulated signal on the basis of the definition signal that defines the waveform of the drive signal Com-P[q] will sometimes be referred to as modulation circuit. That is, the modulation circuit in this exemplary embodiment is a circuit that generates the modulated signal Ms on the basis of the definition signal dCom-P[q] and, concretely, a circuit that includes the DAC 802, the subtractor 804, the adder 806, and the comparator 820.

Although in this exemplary embodiment, the definition signal is the digital definition signal dCom-P[q] as an example, it suffices that the definition signal is a signal that defines a target value for generating the drive signal Com-P[q]. For example, the definition signal may be the analog signal Aa. In the case where the definition signal is the signal Aa, the modulation circuit may be configured without including the DAC 802.

In the case where a modulated signal in a broad sense is adopted, that is, in the case where the modulated signal is not limited to the modulated signal Ms in a strict sense but includes a signal whose logic level has been inverted from that of the modulated signal Ms, it suffices that the modulation circuit includes the gate driver 830.

As shown in FIG. 11, of the transistors TrH and TrL, the transistor TrH at the high side (high-side transistor) receives a voltage Vh (e.g., 42 volts) at its drain electrode. The transistor TrL at the low side (low-side transistor) is grounded at its source electrode.

Each of the transistors TrH and TrL turns on when the gate signal is at the H level. Therefore, at a node Nd connecting the source electrode of the transistor TrH and the drain electrode of the transistor TrL, an amplified signal Az obtained by amplifying the modulated signal Ms appears. In other words, the transistors TrH and TrL output the amplified signal obtained by amplifying the modulated signal Ms.

In the following description, a circuit that generates the amplified signal Az obtained by amplifying the modulated signal Ms will sometimes be referred to as "amplifier circuit 81". In this exemplary embodiment, the amplifier circuit 81 includes transistors TrH and TrL.

As shown in FIG. 11, the drive signal generation circuit GR-P[q] includes an LPF (low-pass filter) 82 that generates the drive signal Com-P[q] by smoothing the amplified signal Az.

The LPF 82 includes an inductor L0 and a capacitor C0. As for the inductor L0, one end is electrically connected to the node Nd and another end is electrically connected to the output terminal Tn-out. As for the capacitor C0, one end is electrically connected to the output terminal Tn-out and another end is grounded.

As shown in FIG. 11, the drive signal generation circuit GR-P[q] includes a pull-up circuit 83 that pulls up the drive signal Com-P[q] output to the output terminal Tn-out and feeds back the pulled-up drive signal Com-P[q] to the terminal Tn1. The pull-up circuit 83 includes a resistor R1 that is electrically connected at one end thereof to the output terminal Tn-out and at another end thereof to the terminal Tn1 and a resistor R2 that is electrically connected at one end thereof to the terminal Tn1 and that receives at another end thereof the voltage Vh.

As shown in FIG. 11, the drive signal generation circuit GR-P[q] includes a BPF (band-pass filter) 84 that feeds back the high-frequency component of the drive signal Com-P[q] to the terminal Tn2 after cutting a direct-current component. The BPF 84 includes a resistor R3, a capacitor C1 that is electrically connected at one end to the output terminal Tn-out and at another end to one end of the resistor R3, a resistor R4 that is electrically connected at one end to the one end of the resistor R3 and that is grounded at another end, a capacitor C2 that is electrically connected at one end to the another end of the resistor R3 and that is grounded at another end, and a capacitor C3 that is electrically connected at one end to the another end of the resistor R3 and at another end to the terminal Tn2.

Of these components of the BPF 84, the capacitor C1 and the resistor R4 function as an HPF (high-pass filter) that passes a high-frequency component of the drive signal Com-P[q] which is higher than or equal to a cut-off frequency. The cut-off frequency of the HPF is set to, for example, about 9 MHz. Furthermore, the resistor R3 and the capacitor C2 function as an LPF (low-pass filter) that passes a low-frequency component of the drive signal Com-P[q] which is lower than or equal to a cut-off frequency. The cut-off frequency of the LPF is set to, for example, about 160 MHz. In this exemplary embodiment, in the BPF 84, the cut-off frequency of the HPF is set lower than the cut-off frequency of the LPF. Therefore, the BPF 84 passes a frequency component of the drive signal Com-P[q] which is within a predetermined band that is higher than or equal to the cut-off frequency of the HPF and lower than or equal to the cut-off frequency of the LPF.

Furthermore, because of being equipped with the capacitor C3, the BPF 84 feeds back to the terminal Tn2 a signal obtained by cutting the direct-current component off from the drive signal Com-P[q] within the predetermined band which has passed through the HPF and LPF.

As shown in FIG. 11, the drive signal generation circuit GR-P[q] generates the drive signal Com-P[q] by smoothing the amplified signal Az provided at the node Nd by using the LPF 82. The drive signal Com-P[q] is then subjected to the integrating and subtracting process in the integral attenuator 812 before being fed back to the subtractor 804. Therefore, self-excited oscillation occurs at a frequency determined by the feedback delay (the sum of the delay by the LPF 82 and the delay by the integral attenuator 812) and the feedback transfer function.

However, since the amount of delay in the feedback path via the terminal Tn1 is large, the feedback via the terminal Tn1 alone cannot achieve a high frequency of the self-excited oscillation which can secure a sufficient accuracy of the waveform of the drive signal Com-P[q].

In this exemplary embodiment, however, in addition to the path via the terminal Tn1, the path via the terminal Tn2 which feeds back the high-frequency component of the drive signal Com-P[q] is provided. Therefore, the delay in the drive signal generation circuits GR-P[q] as a whole can be made small. That is, in the exemplary embodiment, the frequency of the signal As obtained by adding the signal Ay, which is the high-frequency component of the drive signal Com-P[q], to the signal Ab can be made higher than in the case where the path via the terminal Tn2 is not provided, it is possible to secure a sufficient accuracy of the drive signal Com-P[q].

Incidentally, in this exemplary embodiment, the frequency of the self-excited oscillation (frequency of the modulated signal Ms) is higher than or equal to 1 MHz and lower than or equal to 8 MHz. Because the modulated signal Ms has such a frequency, it is possible to achieve both securement of a sufficient accuracy of the waveform of the drive signal Com-P[q] and prevention or reduction of the switching loss of the transistors TrH and TrL.

4.3. Generation of Modulated Signal by Comparator

Figure 12:
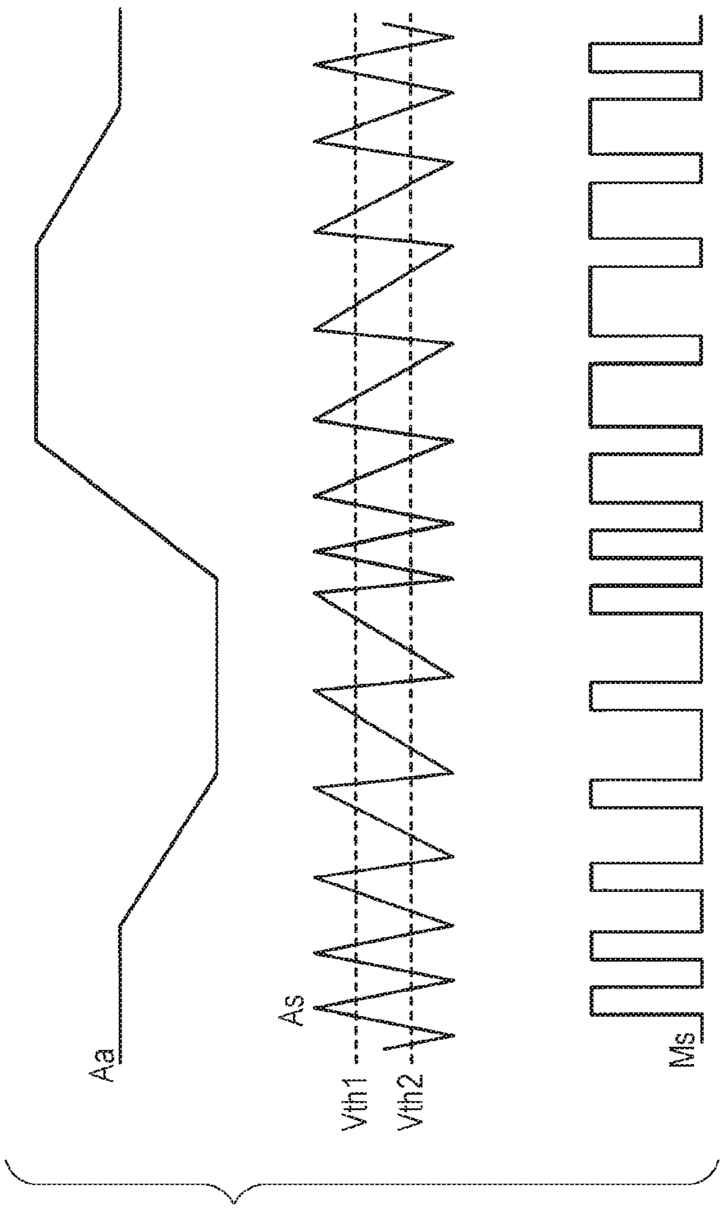
FIG. 12 is an illustrative diagram for describing an operation of a drive signal generation circuit.

FIG. 12 shows a relation between the signal Aa, the signal As, and the modulated signal Ms. With reference to FIG. 12, the generation of the modulated signal Ms by the comparator 820 will be described.

As shown in FIG. 12, the signal As is a triangular wave signal whose oscillatory frequency changes according to the voltage (input voltage) of the signal Aa. Concretely, the oscillatory frequency of the signal As becomes highest when the input voltage is at an intermediate value, and decreases with the input voltage increasing from the intermediate value, and also decreases with the input voltage decreasing from the intermediate value.

Furthermore, as for the triangular waves shown by the signal As, upward slopes (rising voltage) and downward slopes (falling voltage) are substantially equal to each other if the input voltage is at or around the intermediate value. Therefore, the duty ratio of the modulated signal Ms provided as a result of the comparison of the signal As with the threshold value voltages Vth1 and Vth2 performed by the comparator 820 is approximately 50%. As the input voltage increases from the intermediate value, the downward slope of the signal As becomes gentle. Therefore, the period during which the modulated signal Ms is at the H level becomes relatively long, and therefore the duty ratio becomes large. On the other hand, as the input voltage decreases from the intermediate value, the upward slope of the signal As becomes gentler. Therefore, the period during which the modulated signal Ms is at the high level becomes relatively short, and therefore the duty ratio becomes small.

Therefore, the modulated signal Ms becomes a pulse density modulated signal such that the duty ratio of the modulated signal Ms is approximately 50% when the input voltage is at the intermediate value, and increases with the input voltage increasing from the intermediate value, and decreases with the input voltage decreasing from the intermediate value.

The gate driver 830 turns on the transistor TrH when the modulated signal Ms is at the H level, and turns off the transistor TrH when the modulated signal Ms is at the L level. Furthermore, the gate driver 830 turns off the transistor TrL when the modulated signal Ms is at the H level, and turns on the transistor TrL when the modulated signal Ms is at the L level.

Therefore, the voltage of the drive signal Com-P[q] obtained by smoothing the amplified signal Az provided at the node Nd electrically connecting the transistors TrH and TrL by using the LPF 82 becomes higher with the duty ratio of the modulated signal Ms increasing, and becomes lower with the duty ratio thereof decreasing. Hence, the drive signal Com-P[q] has a waveform that is obtained by enlarging the waveform that the analog signal Aa has.

Thus, since the drive signal generation circuits GR-P[q] use pulse density modulation, the drive signal generation circuits GR-P[q] have an advantage of being able to allow a large width of change in duty ratio in comparison with pulse width modulation in which the modulation frequency is fixed.

Furthermore, the drive signal generation circuits GR-P[q] are self-excited oscillation circuits and, unlike a separately-excited oscillation circuit, do not need a circuit that generates a high-frequency carrier wave. Therefore, each drive signal generation circuit GR-P[q] has an advantage that the functions of portions of the circuit that are other than a portion that handles high voltage, that is, the functions that the LSI 80 perform, can easily be integrated.

Furthermore, in the drive signal generation circuits GR-P[q], since the feedback path of the drive signal Com-P[q] includes not only the path via the terminal Tn1 but also the path for feeding back the high-frequency component via the terminal Tn2, the delay in the circuit as a whole is relatively small. Therefore, in the drive signal generation circuits GR-P[q], the self-excited oscillation frequency becomes high, and therefore the drive signal Com-P[q] can be accurately generated.

4.4. Arrangement of Drive Signal Generation Circuit on Drive Board

Next, with reference to FIGS. 13 and 14, an arrangement of the drive signal generation portions GR[1] to GR[Q] on the drive board 800, that is, an arrangement of the drive signal generation circuits GR-A[1] to GR-A[Q] and the drive signal generation circuits GR-B[1] to GR-B[Q], will be described.

Figure 13:
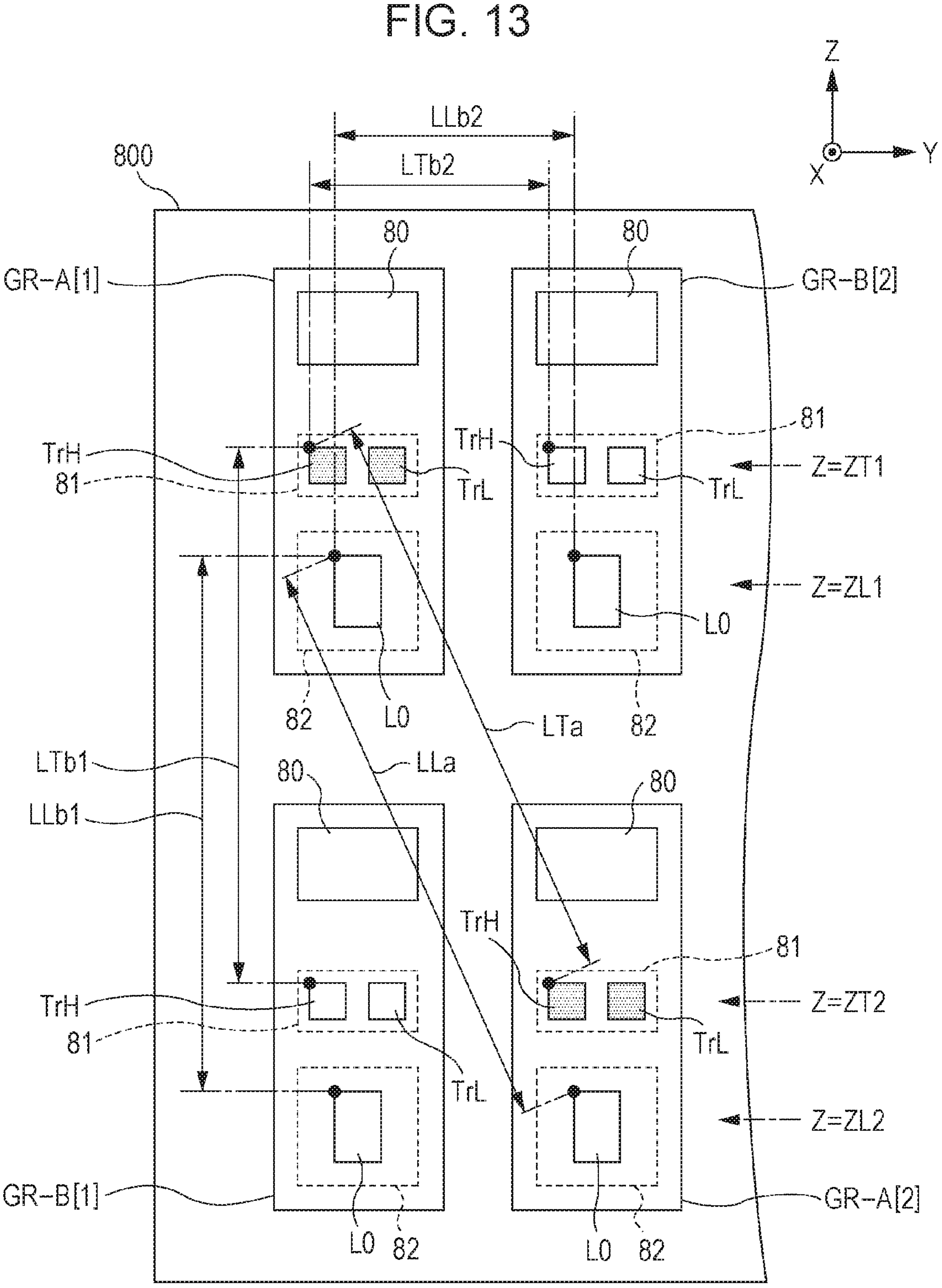
FIG. 13 is a diagram showing an arrangement of drive signal generation circuits.

FIG. 13 is a view of the drive board 800 and the drive signal generation portions GR[1] to GR[Q] formed on the drive board 800 according to the exemplary embodiment, viewed from a +X direction indicated in FIG. 13, which is a direction perpendicular to the drive board 800. In the following description, in addition to the variable q, a variable q1 that is an odd number that satisfies the inequality 1≤q1≤Q and a variable q2 that is an even number that satisfies both the inequality 1≤q2≤Q and the equation q2=1+q1 will be introduced.

Figure 14:
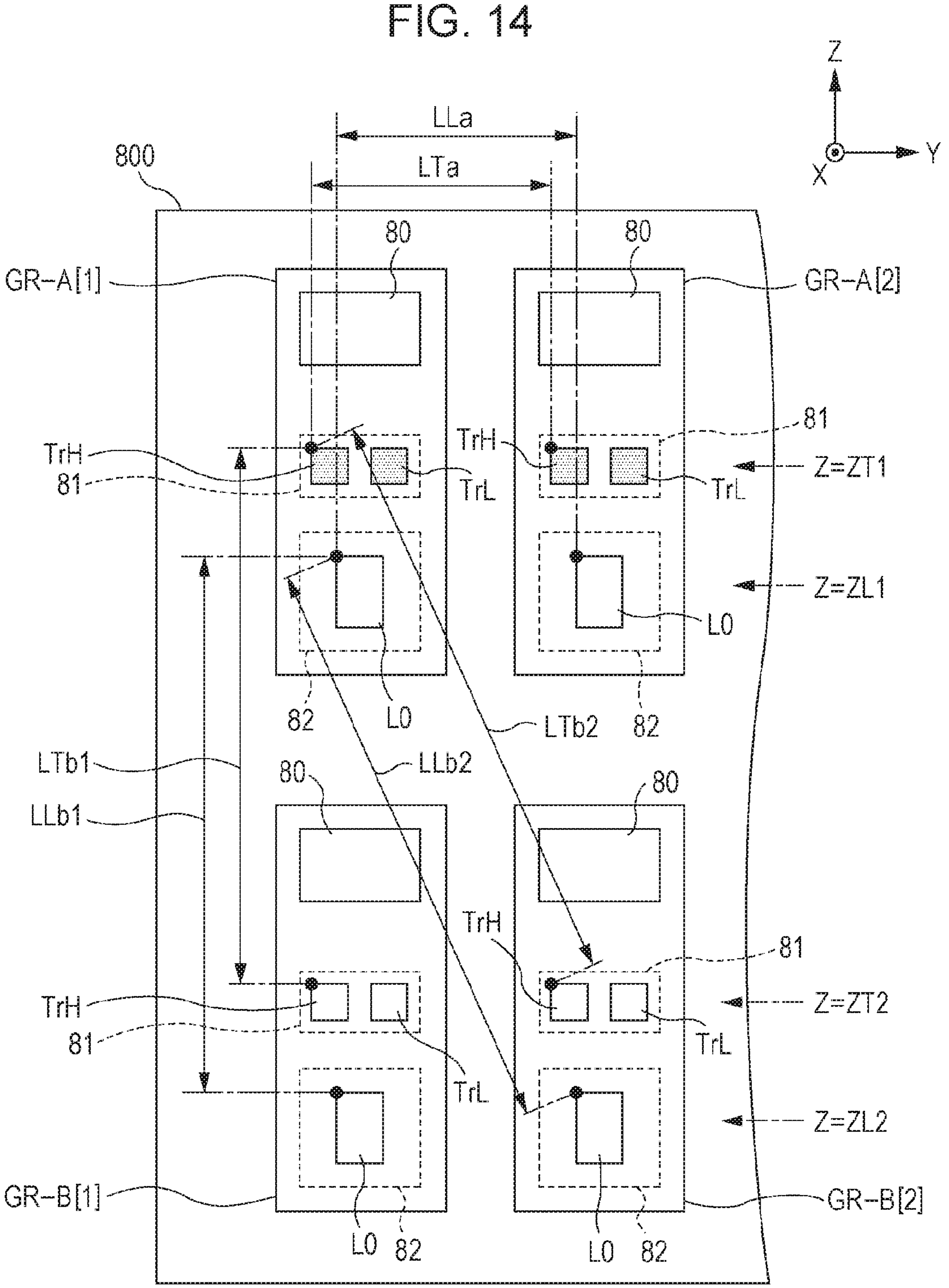
FIG. 14 is a diagram showing an arrangement of drive signal generation circuits according to a contrastive example.

FIG. 13 and FIG. 14, which will be described later, show the cases where q1=1 and q2=2 as examples.

Although in this exemplary embodiment, the variable q1 is an odd number and the variable q2 is an even number, it suffices that one of the variable q1 and the variable q2 is an even number and the other is an odd number and, therefore, it is also permissible that the variable q1 be an even number and the variable q2 be an odd number.

As shown in FIG. 13, the two drive signal generation circuits GR-P[q1] that a drive signal generation portion GR[q1] has are provided on the drive board 800 so that the drive signal generation circuit GR-A[q1] is to a +Z side of the drive signal generation circuit GR-B[q1]. Furthermore, the two drive signal generation circuits GR-P[q2] that the drive signal generation portion GR[q2] has are provided on the drive board 800 so that the drive signal generation circuit GR-A[q2] is to the −Z side of the drive signal generation circuit GR-B[q2]. That is, in this exemplary embodiment, the direction from the drive signal generation circuit GR-A[q1] to the drive signal generation circuit GR-B[q1] is opposite to the direction from the drive signal generation circuit GR-A[q2] to the drive signal generation circuit GR-B[q2].

Therefore, as shown in FIG. 13, the distance LTa from a reference position of the amplifier circuit 81 of the drive signal generation circuit GR-A[q1] to a reference position of the amplifier circuit 81 of the drive signal generation circuit GR-A[q2] is longer than the distance LTb1 from a reference position of the amplifier circuit 81 of the drive signal generation circuit GR-A[q1] to a reference position of the amplifier circuit 81 of the drive signal generation circuit GR-B[q1], and is longer than the distance LTb2 from the reference position of the amplifier circuit 81 of the drive signal generation circuit GR-A[q1] to a reference position of the amplifier circuit 81 of the drive signal generation circuit GR-B[q2]. Likewise, the distance LLa from a reference position of the LPF 82 of the drive signal generation circuit GR-A[q1] to a reference position of the LPF 82 of the drive signal generation circuit GR-A[q2] is longer than the distance LLb1 from a reference position of the LPF 82 of the drive signal generation circuit GR-A[q1] to a reference position of the LPF 82 of the drive signal generation circuit GR-B[q1], and is longer than the distance LLb2 from the reference position of the LPF 82 of the drive signal generation circuit GR-A[q1] to a reference position of the LPF 82 of the drive signal generation circuit GR-B[q2].

Incidentally, in FIG. 13, as an example, an upper left position on the transistor TrH of each amplifier circuit 81 (the position thereon that is furthest to the +Z side and to the −Y side) is defined as the reference position of the amplifier circuit 81 to determine the distances LTa, LTb1, and LTb2, and an upper left position on the inductor L0 of each LPF 82 is defined as the reference position of the LPF 82 to determine the distance LLa, LLb1, and LLb2.

In contrast, in an arrangement as exemplified in FIG. 14 in which the drive signal generation circuits GR-P[q] are disposed so that the direction from the drive signal generation circuit GR-A[q1] to the drive signal generation circuit GR-B[q1] is the same as the direction from the drive signal generation circuit GR-A[q2] to the drive signal generation circuit GR-B[q2] (hereinafter, the arrangement exemplified in FIG. 14 will be referred to as "contrastive example"), the distance LTa is shorter than the distance LTb1 and shorter than the distance LTb2, and the distance LLa is shorter than the distance LLb1 and shorter than the distance LLb2.

That is, in the exemplary embodiment shown in FIG. 13, in comparison with the contrastive example shown in FIG. 14, the distance between the amplifier circuit 81 provided in the drive signal generation circuit GR-A[q1] and the amplifier circuit 81 provided in the drive signal generation circuit GR-A[q2] can be made long and the distance between the LPF 82 provided in the drive signal generation circuit GR-A[q1] and the LPF 82 provided in the drive signal generation circuit GR-A[q2] can be made long.

As stated above, the drive signal generation circuit GR-A[q] is a circuit for generating the drive signal Com-A[q], and the drive signal generation circuit GR-B[q] is a circuit for generating the drive signal Com-B[q]. The drive signal Com-A[q], which contains the discharge waveform PA1 and the discharge waveform PA2, is a large-amplitude signal whereas the drive signal Com-B[q], which is a mere signal that contains the microvibration waveforms PB, is a small-amplitude signal as compared with the drive signal Com-A[q]. Therefore, the amount of heat produced by the transistors TrH and TrL of the amplifier circuit 81 of the drive signal generation circuit GR-A[q] when the amplifier circuit 81 of the drive signal generation circuit GR-A[q] generates the amplified signal Az by amplifying the modulated signal Ms is larger than the amount of heat produced by the transistors TrH and TrL of the amplifier circuit 81 of the drive signal generation circuit GR-B[q] when the amplifier circuit 81 of the drive signal generation circuit GR-B[q] generates the amplified signal Az.

Hence, in the contrastive example shown in FIG. 14, in the drive board 800, the vicinity of a straight line Z=ZT1 on which the transistors TrH and TrL of the drive signal generation circuit GR-A[q] are provided becomes hot and the vicinity of a straight line Z=ZL1 on which the inductor L0 of the drive signal generation circuit GR-A[q] is provided becomes hot. That is, in the contrastive example, heat produced from the drive signal generation portions GR[1] to GR[Q] concentrate into a region between the straight line Z=ZT1 and the straight line Z=ZL1. As a result, there is an increased possibility that a defective condition caused by heat production may occur in the transistor TrH or TrL, the LSI 80, or the like in the drive signal generation circuit GR-A[q] and image quality deterioration may occur in the print process.

In contrast, in the exemplary embodiment, as shown in FIG. 13, the Q number of sets of transistors TrH and TrL of the drive signal generation circuits GR-A[1] to GR-A[Q] are provided in a dispersed manner, that is, in the vicinity of the straight line Z=ZT1 and the vicinity of the straight line Z=ZT2, and the Q number of inductors L0 of the drive signal generation circuits GR-A[1] to GR-A[Q] are provided dispersedly in the vicinity of the straight line Z=ZL1 and the vicinity of the straight line Z=ZL2. Therefore, in this exemplary embodiment, heat produced by the drive signal generation portions GR[1] to GR[Q] is dispersed to a broad region extending between the straight line Z=ZT1 and the straight line Z=ZL2, so as to prevent a fractional region of the drive board 800 from becoming hot. As a result, the possibility of heat causing a defective condition in the transistor TrH or TrL, the LSI 80, or the like in a drive signal generation circuit GR-A[q] can be reduced and, therefore, it becomes possible to prevent or reduce image quality deterioration in the print process.

Although in FIG. 13, the drive signal generation circuit GR-A[q1] is provided at the +Z side of the drive signal generation circuit GR-B[q1] and the drive signal generation circuit GR-A[q2] is provided at the −Z side of the drive signal generation circuit GR-B[q2], this is a mere example and it is also permissible that the drive signal generation circuit GR-A[q1] be provided at the −Z side of the drive signal generation circuit GR-B[q1] and that the drive signal generation circuit GR-A[q2] be provided at the +Z side of the drive signal generation circuit GR-B[q2]. That is, in this exemplary embodiment, it suffices that the position of the drive signal generation circuit GR-A[q1] in the Z-axis direction and the position of the drive signal generation circuit GR-A[q2] in the Z-axis direction are different from each other.

5. Conclusion on Exemplary Embodiment

As described above, in the exemplary embodiment, since the position of the drive signal generation circuit GR-A[q1] in the Z-axis direction and the position of the drive signal generation circuit GR-A[q2] in the Z-axis direction are different from each other, the possibility that heat produced from the drive signal generation portions GR[1] to GR[Q] may concentrate into a fractional region in the drive board 800 can be reduced in comparison with the arrangement in which the positions of the drive signal generation circuits GR-A[1] to GR-A[Q] in the Z-axis direction are substantially the same. Therefore, the possibility of the drive board 800 becoming hot can be made low, so that occurrence of a heat-caused defective condition in the drive signal generation portions GR can be prevented and the deterioration of printed image quality due to heat production can be prevented.

Note that in the exemplary embodiment, the large-amplitude drive signals Com-A[q1] and Com-A[q2] are examples of a "first drive signal" and a "third drive signal", respectively, and the small-amplitude drive signals Com-B[q1] and Com-B[q2] are examples of a "second drive signal" and a "fourth drive signal", respectively. Furthermore, the drive signal generation circuit GR-A[q1] that generates the first drive signal is an example of a "first generator", the drive signal generation circuit GR-B[q1] that generates the second drive signal is an example of a "second generator", and the head unit HU[q1] that is driven by the first drive signal and the second drive signal is an example of a "first head unit". Further, the drive signal generation circuit GR-A[q2] that generates the third drive signal is an example of a "third generator", the drive signal generation circuit GR-B[q2] that generates the fourth drive signal is an example of a "fourth generator", and the head unit HU[q2] that is driven by the third drive signal and the fourth drive signal is an example of a "second head unit".

Furthermore, in the exemplary embodiment, the drive board 800 is an example of a "circuit substrate" where the first to fourth generators are provided.

Further, in the exemplary embodiment, one of the transistors TrH and TrL provided in the amplifier circuit 81 of the drive signal generation circuit GR-A[q1] (an example of a "first amplifier"), which is an example of the first generator, corresponds to a "first transistor". One of the transistors TrH and TrL provided in the amplifier circuit 81 of the drive signal generation circuit GR-B[q1] (an example of a "second amplifier"), which is an example of the second generator, corresponds to a "second transistor". One of the transistors TrH and TrL provided in the amplifier circuit 81 of the drive signal generation circuit GR-A[q2] (an example of a "third amplifier"), which is an example of the third generator, corresponds to a "third transistor". One of the transistors TrH and TrL provided in the amplifier circuit 81 of the drive signal generation circuit GR-B[q2] (an example of a "fourth amplifier"), which is an example of the fourth generator, corresponds to a "fourth transistor".

Still further, in the exemplary embodiment, the four modulation circuits provided in the first to fourth generators correspond to "first to fourth modulators", and the four LPFs 82 provided in the first to fourth generators correspond to "first to fourth smoothers". Further, the definition signals supplied to the first to fourth modulators correspond to "first to fourth definition signals", the modulated signals Ms supplied to the first to fourth modulators correspond to "first to fourth modulated signals", and the amplified signals Az generated by the first to fourth amplifiers correspond to "first to fourth amplified signals". Further, the four inductors L0 and the four capacitors C0 provided in the first to fourth smoothers correspond to "first to fourth inductors" and "first to fourth capacitors", respectively, that are provided to smooth the first to fourth amplified signals.

B. Modifications

The foregoing embodiment and forms can be modified in various manners. Concrete modifications will be described as examples. Any two or more forms or modifications selected form what will be described below can be appropriately combined as long as they do not contradict each other. Incidentally, in the modifications illustrated as examples below, elements substantially the same in operation or function as those in the foregoing exemplary embodiment will be represented by the same reference signs as used above and detailed descriptions thereof will be omitted.

Modification 1

Figure 15:
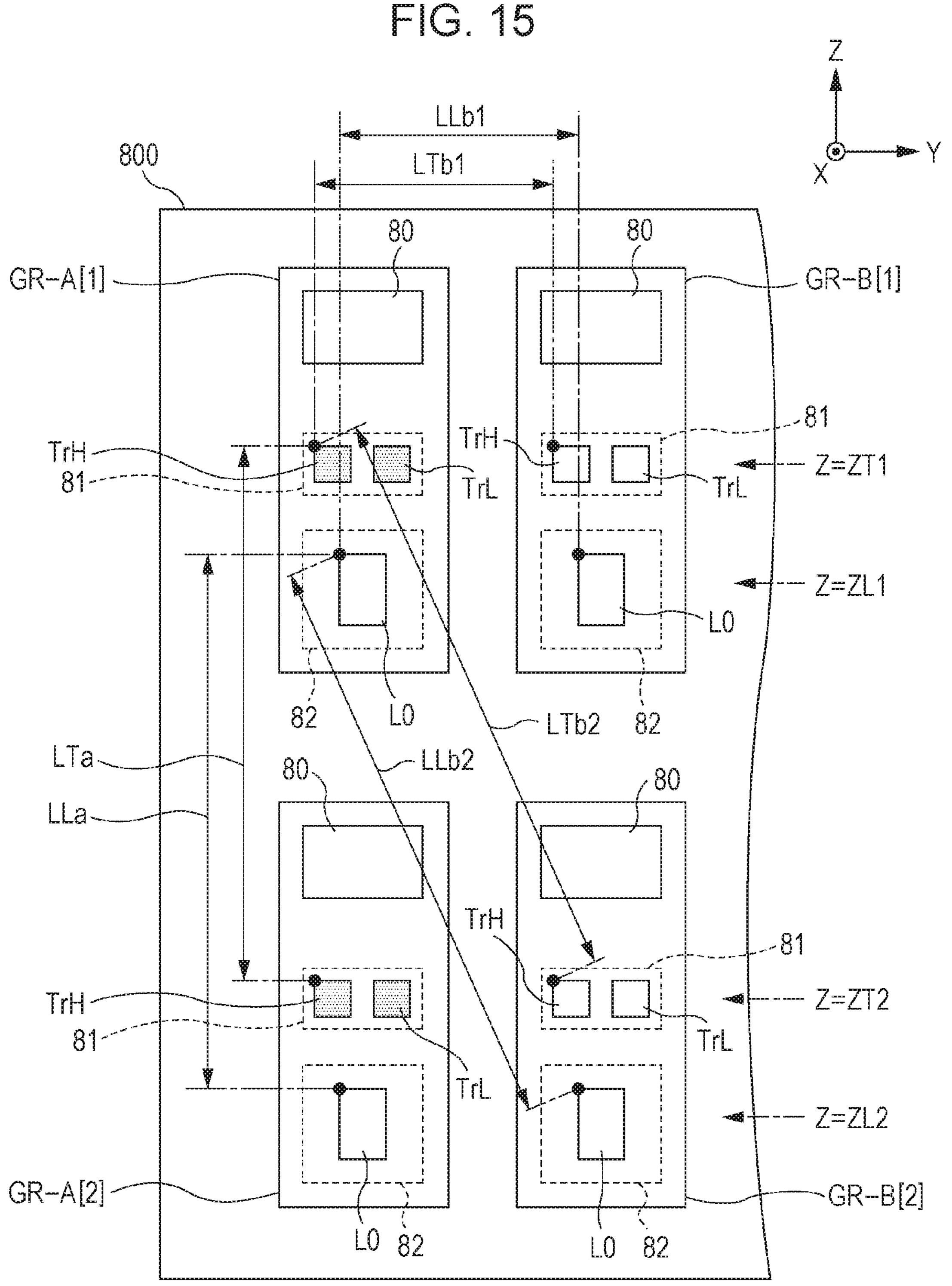
FIG. 15 is a diagram showing an arrangement of drive signal generation circuits according to Modification 1 of the exemplary embodiment.

Although in the foregoing exemplary embodiment, the drive signal generation circuits GR-A[q] and GR-B[q] provided on the drive board 800 are adjacent to each other in the Z-axis direction, the invention is not limited to such a configuration. For example, as exemplified in FIG. 15, the drive signal generation circuits GR-A[q] and GR-B[q] may be provided on the drive board 800 so as to be adjacent to each other in the Y-axis direction. That is, as shown in FIG. 15, the drive signal generation circuits GR-A[q] and GR-B[q] may be provided so that the drive signal generation circuits GR-A[q1] and GR-B[q1] are adjacent to each other in the Y-axis direction on the drive board 800 and the drive signal generation circuits GR-A[q2] and GR-B[q2] are adjacent to each other in the Y-axis direction on the drive board 800. In this case, the distance LTa can be made longer than the distance LTb1, and the distance LLa can be made longer than the distance LLb1.

In this modification, as shown in FIG. 15, the Q number of sets transistors TrH and TrL of the drive signal generation circuits GR-A[1] to GR-A[Q] can be disposed dispersedly on the straight line Z=ZT1 and the straight line Z=ZT2, and the Q number of inductors L0 of the drive signal generation circuits GR-A[1] to GR-A[Q] can be disposed dispersedly on the straight line Z=ZL1 and the straight line Z=ZL2. Furthermore, in this Besides, the drive signal generation circuit GR-B[q1] is interposed between the drive signal generation circuits GR-A[q1] and GR-A[2+q1] in the Y-axis direction.

Thus, in this modification, in comparison with the contrastive example shown in FIG. 14, the distance LTa between the amplifier circuit 81 provided in the drive signal generation circuit GR-A[q1] and the amplifier circuit 81 provided in the drive signal generation circuit GR-A[q2] can be made long and the distance LLa between the LPF 82 provided in the drive signal generation circuit GR-A[q1] and the LPF 82 provided in the drive signal generation circuit GR-A[q2] can be made long. Therefore, in this modification, heat produced by the drive signal generation portions GR[1] to GR[Q] can be prevented from concentrating into a fractional region in the drive board 800, so that various adverse effects caused by high temperature of the drive board 800, for example, breakage of the drive signal generation circuit GR-A[q], deterioration of image quality in the print process, etc., can be prevented.

Modification 2

Although in the foregoing exemplary embodiment and modification, the reference position of each amplifier circuit 81 for determining the distances LTa, LTb1, and LTb2 are the upper left position on the transistor TrH, the invention is not limited to such a configuration but the reference position of each amplifier circuit 81 can be set at any position relative to the amplifier circuit 81. For example, the reference position of each amplifier circuit 81 may be a lower right position on the transistor TrL or may also be any position between the transistors TrH and TrL.

Likewise, although in the foregoing exemplary embodiment and modification, the reference position of each LPF 82 for determining the distances LLa, LLb1, and LLb2 is the upper left position on the inductor L0, the reference position of each LPF 82 may be any position relative to the LPF 82.

Modification 3

Although in the foregoing exemplary embodiment and modifications, the distances LTa, LTb1, and LTb2 are each defined as the distance between the reference position of the amplifier circuit 81 of a drive signal generation circuit GR-P and the reference position of the amplifier circuit 81 of another drive signal generation circuit GR-P, this feature does not limit the invention, the distances LTa, LTb1, and LTb2 may be defined in any manner as long as each distance is defined so as to represent a distance or an interval between a component element of the amplifier circuit 81 of a drive signal generation circuit GR-P and a component element of the amplifier circuit 81 of another drive signal generation circuit GR-P. For example, each of the distances LTa, LTb1, and LTb2 may be an interval (shortest distance) between the amplifier circuit 81 of a drive signal generation circuit GR-P and the amplifier circuit 81 of another drive signal generation circuit GR-P and may also be an interval (shortest distance) between the transistor TrH or TrL of a drive signal generation circuit GR-P and the transistor TrH or TrL of another drive signal generation circuit GR-P.

Likewise, the distances LLa, LLb1, and LLb2 may be defined in any manner as long as each distance is defined so as to represent a distance or an interval between a component element of the LPF 82 of a drive signal generation circuit GR-P and a component element of the LPF 82 of another drive signal generation circuit GR-P. For example, each of the distances LLa, LLb1, and LLb2 may be the shortest distance between the LPF 82 of a drive signal generation circuit GR-P and the LPF 82 of another drive signal generation circuit GR-P.

Modification 4

Although in the exemplary embodiment and modifications, each of the drive signal generation circuits GR-P[q] is a so-called class D amplifier circuit that generates the modulated signal Ms on the basis of the definition signal dCom-P[q], controls the on and off-states of the transistors TrH and TrL according to the signal level of the modulated signal Ms to generate the amplified signal Az amplified from the modulated signal Ms, and then smooths the amplified signal Az to generate the drive signal Com-P[q], the invention is not limited to this configuration. The drive signal generation circuits GR-P[q] may be any amplifier circuits as long as each drive signal generation circuit GR-P[q] amplifies the definition signal dCom-P[q] or a definition signal, such as the signal Aa, obtained by convert the definition signal dCom-P[q] so as to generate the drive signal Com-P[q]. For example, each of the drive signal generation circuits GR-P[q] may be an amplifier circuit that includes a transistor for amplifying a waveform that the definition signal shows.

Modification 5

Although the ink jet printer 1 according to the foregoing exemplary embodiment and modifications is a line printer in which the nozzle arrays NL are provided so that the range YNL contains the range YP, the invention is not limited to this feature. The ink jet printer 1 may also be a serial printer that executes the print process by moving the head module 5 back and forth in the Y-axis direction.

Modification 6

Although the ink jet printer 1 according to the foregoing exemplary embodiment and modifications is capable of discharging four color inks of cyan, magenta, yellow, and black (CMYK), the invention is not limited to this feature. It suffices that the ink jet printer 1 is capable of discharging at least one color ink, and the ink jet printer 1 may use a color ink other than the CMYK inks.

Furthermore, although the ink jet printer 1 according to the foregoing exemplary embodiment and modifications is equipped with the four nozzle arrays NL, it suffices that the ink jet printer 1 is equipped with at least one nozzle array NL.

Furthermore, although in the foregoing exemplary embodiment and modifications, M for the M number of discharge portions D that each recording head Hd[q] has is a natural number greater than or equal to 4, that is, each recording head Hd[q] has four or more discharge portions D, it suffices that M is a natural number greater than or equal to 1, that is, each recording head Hd[q] has at least one discharge portion D.

Modification 7

Although in the foregoing exemplary embodiment and modifications, the drive signal Com-B contains only the microvibration waveform that does not cause discharge of ink, this feature does not limit the invention. The drive signal Com-B may also contain a discharge waveform as long as the amplitude of the drive signal Com-B is smaller than that of the drive signal Com-A. In the case where the drive signal Com-B contains a discharge waveform, the non-discharge of ink from the discharge portion D can be achieved by turning off both the transmission gates TGa and TGb in the switching portion TX of the head driver DR and therefore stopping the supply of the drive signals Com-A and Com-B to the discharge portion D.

Modification 8

Although in the foregoing exemplary embodiment and modifications, the drive signal Com contains the drive signals Com-A and Com-B, that is, signals of two systems, this feature does not limit the invention. The drive signal Com may contain signals of three or more systems. For example, the drive signal Com may be a signal that contains drive signals Com-A, Com-B and Com-C.

Furthermore, although in the foregoing exemplary embodiment and modifications, the unit period Tu includes two control periods Ts1 and Ts2, this feature does not limit the invention. The unit period Tu may be made up of a single control period Ts or may include three or more control periods Ts.

Further, although in the foregoing exemplary embodiment and modifications, the print signal SI[q][m] is a two-bit signal, the number of bits of the print signal SI[q][m] may be appropriately determined according to the number of gradations to be displayed, the number of control periods Ts included in the unit period Tu, the number of systems of signals contained in the drive signal Com, etc.

What is claimed is:

1. A liquid discharge apparatus comprising:

a first head that is driven by a first drive signal and a second drive signal and that is capable of discharging a liquid;

a second head that is driven by a third drive signal and a fourth drive signal and that is capable of discharging a liquid;

a circuit substrate;

a first generator that is provided on the circuit substrate and that generates the first drive signal;

a second generator that is provided on the circuit substrate and that generates the second drive signal;

a third generator that is provided on the circuit substrate and that generates the third drive signal; and a fourth generator that is provided on the circuit substrate and that generates the fourth drive signal, wherein:

the first generator includes a first modulator that generates a first modulated signal by pulse-modulating a first definition signal that defines a waveform of the first drive signal, a first amplifier that includes a first transistor and that generates a first amplified signal by amplifying the first modulated signal by using the first transistor, and a first smoother that generates the first drive signal by smoothing the first amplified signal;

the second generator includes a second modulator that generates a second modulated signal by pulse-modulating a second definition signal that defines a waveform of the second drive signal, a second amplifier that includes a second transistor and that generates a second amplified signal by amplifying the second modulated signal by using the second transistor, and a second smoother that generates the second drive signal by smoothing the second amplified signal;

the third generator includes a third modulator that generates a third modulated signal by pulse-modulating a third definition signal that defines a waveform of the third drive signal, a third amplifier that includes a third transistor and that generates a third amplified signal by amplifying the third modulated signal by using the third transistor, and a third smoother that generates the third drive signal by smoothing the third amplified signal;

the fourth generator includes a fourth modulator that generates a fourth modulated signal by pulse-modulating a fourth definition signal that defines a waveform of the fourth drive signal, a fourth amplifier that includes a fourth transistor and that generates a fourth amplified signal by amplifying the fourth modulated signal by using the fourth transistor, and a fourth smoother that generates the fourth drive signal by smoothing the fourth amplified signal;

an amount of heat that the first transistor produces when generating the first amplified signal is larger than an amount of heat that the second transistor produces when generating the second amplified signal;

an amount of heat that the third transistor produces when generating the third amplified signal is larger than an amount of heat that the fourth transistor produces when generating the fourth amplified signal; and distance between the first transistor and the third transistor is longer than at least one of distance between the first transistor and the second transistor and distance between the first transistor and the fourth transistor.

2. The liquid discharge apparatus according to claim 1, wherein:

the first smoother includes a first inductor and a first capacitor for smoothing the first amplified signal;

the second smoother includes a second inductor and a second capacitor for smoothing the second amplified signal;

the third smoother includes a third inductor and a third capacitor for smoothing the third amplified signal;

the fourth smoother includes a fourth inductor and a fourth capacitor for smoothing the fourth amplified signal; and distance between the first inductor and the third inductor is longer than at least one of distance between the first inductor and the second inductor and distance between the first inductor and the fourth inductor.

3. The liquid discharge apparatus according to claim 1, wherein the distance between the first transistor and the third transistor is longer than the distance between the first transistor and the second transistor and longer than the distance between the first transistor and the fourth transistor.

4. The liquid discharge apparatus according to claim 1, wherein the first modulated signal, the second modulated signal, the third modulated signal, and the fourth modulated signal have a frequency greater than or equal to 1 MHz and less than or equal to 8 MHz.

5. The liquid discharge apparatus according to claim 1, wherein:

volume of the liquid that the first head is capable of discharging when driven by the first drive signal is larger than volume of the liquid that the first head is capable of discharging when driven by the second drive signal; and volume of the liquid that the second head is capable of discharging when driven by the third drive signal is larger than volume of the liquid that the second head is capable of discharging when driven by the fourth drive signal.

6. A liquid discharge apparatus comprising:

a first head that is driven by a first drive signal and a second drive signal and that is capable of discharging a liquid;

a second head that is driven by a third drive signal and a fourth drive signal and that is capable of discharging a liquid;

a circuit substrate;

a first generator that is provided on the circuit substrate and that generates the first drive signal;

a second generator that is provided on the circuit substrate and that generates the second drive signal;

a third generator that is provided on the circuit substrate and that generates the third drive signal; and a fourth generator that is provided on the circuit substrate and that generates the fourth drive signal, wherein:

the first generator includes a first transistor for amplifying a first definition signal that defines a waveform of the first drive signal, and generates the first drive signal according to a signal having been amplified by the first transistor;

the second generator includes a second transistor for amplifying a second definition signal that defines a waveform of the second drive signal, and generates the second drive signal according to a signal having been amplified by the second transistor;

the third generator includes a third transistor for amplifying a third definition signal that defines a waveform of the third drive signal, and generates the third drive signal according to a signal having been amplified by the third transistor;

the fourth generator includes a fourth transistor for amplifying a fourth definition signal that defines a waveform of the fourth drive signal, and generates the fourth drive signal according to a signal having been amplified by the fourth transistor;

an amplitude of the first drive signal is larger than an amplitude of the second drive signal;

an amplitude of the third drive signal is larger than an amplitude of the fourth drive signal; and a distance between the first transistor and the third transistor is longer than at least one of a distance between the first transistor and the second transistor and a distance between the first transistor and the fourth transistor.

* * * * *